(12) United States Patent
Sasagawa

(10) Patent No.: US 7,068,565 B2
(45) Date of Patent: Jun. 27, 2006

(54) CLOCK CONTROL IN SEQUENTIAL CIRCUIT FOR LOW-POWER OPERATION AND CIRCUIT CONVERSION TO LOW-POWER SEQUENTIAL CIRCUIT

(75) Inventor: Yukihiro Sasagawa, Kyoto (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 188 days.

(21) Appl. No.: 10/776,287

(22) Filed: Feb. 12, 2004

(65) Prior Publication Data

US 2004/0160852 A1    Aug. 19, 2004

(30) Foreign Application Priority Data

Feb. 13, 2003    (JP) ............... 2003-034532

(51) Int. Cl.
*G11C 8/00*    (2006.01)
*G11C 7/22*    (2006.01)

(52) U.S. Cl. ............ 365/233; 365/189.07; 365/189.05; 365/154

(58) Field of Classification Search ................ 365/233, 365/230.06, 205, 189.05, 189.07, 154; 327/202, 327/199
See application file for complete search history.

(56) References Cited

U.S. PATENT DOCUMENTS

| | | | |
|---|---|---|---|
| 3,646,520 A | 2/1972 | Spencer | |
| 3,803,594 A | 4/1974 | Klein et al. | |
| 5,557,225 A * | 9/1996 | Denham et al. | ............ 327/199 |
| 6,240,047 B1 | 5/2001 | Koelling et al. | |
| 6,272,656 B1 | 8/2001 | Yoshiyama | |
| 6,487,246 B1 | 11/2002 | Hoeld | |
| 6,792,554 B1 * | 9/2004 | Gervais et al. | ............. 713/600 |
| 6,914,956 B1 * | 7/2005 | Kawasaki et al. | ............ 377/68 |
| 2003/0090307 A1 | 5/2003 | Shin | |

FOREIGN PATENT DOCUMENTS

| | | |
|---|---|---|
| JP | 8-263466 | 10/1996 |
| JP | 11-149496 | 6/1999 |

* cited by examiner

*Primary Examiner*—Tuan T. Nguyen
*Assistant Examiner*—Alexander Sofocleous
(74) *Attorney, Agent, or Firm*—McDermott Will & Emery LLP

(57) ABSTRACT

Clock control of a sequential circuit is realized with the assumptions that stop of a clock is impossible due to the specifications, and feedback of the output of a memory element does not exist. To this end, the sequential circuit includes a variation detector for detecting a variation occurred in the content of any of master cells which are memory elements included in a master cell group to output a clock control signal, and a clock pulse generator for receiving the clock control signal to generate a clock pulse and supplying the clock pulse to a slave cell which is a memory element included in a clock domain and whose input is varied when the content of any of the master cells which are memory elements included in the master cell group is varied.

27 Claims, 26 Drawing Sheets

FIG. 17
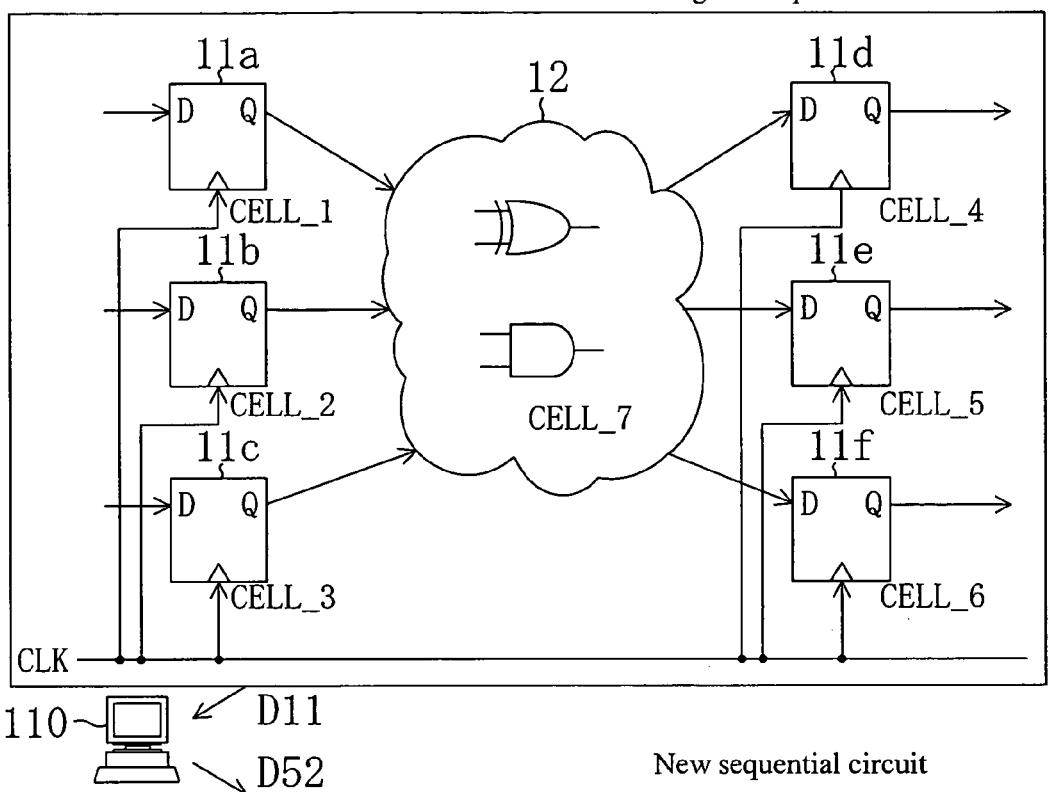
Original sequential circuit
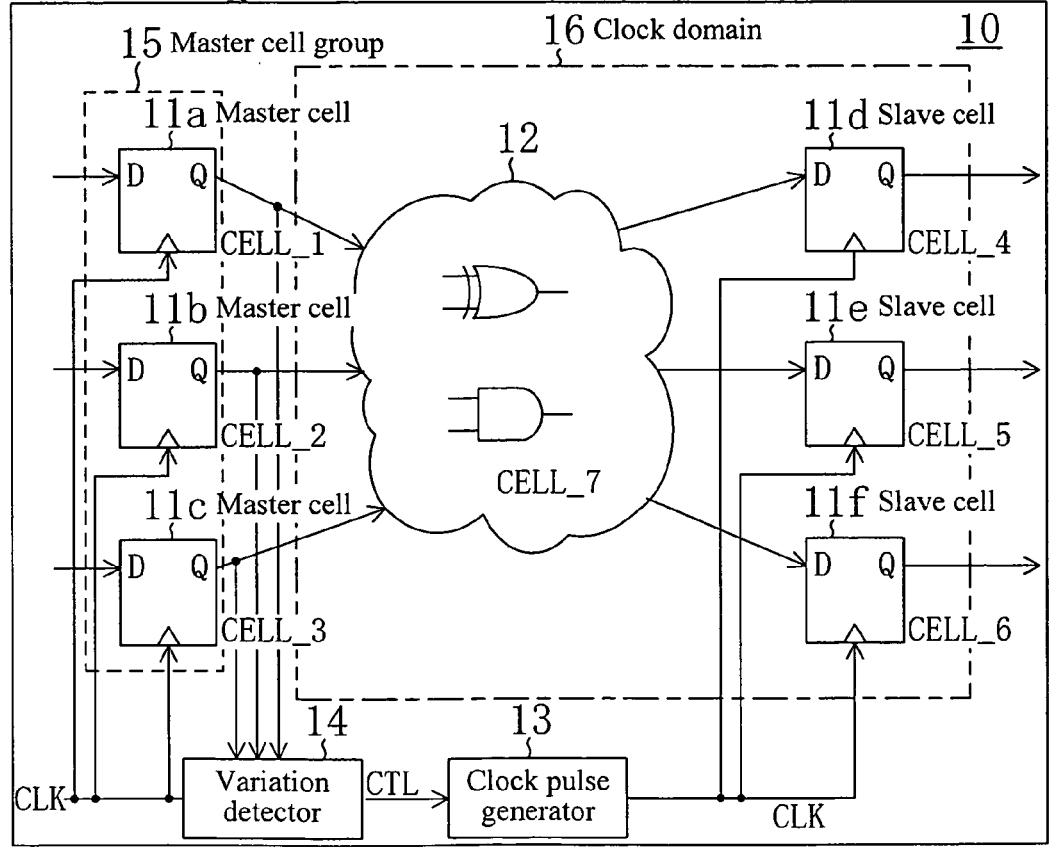
New sequential circuit

FIG. 20

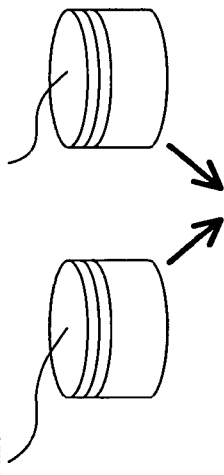
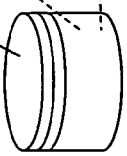

D11 Connection information of original sequential circuit
D23 Master cell name list
S31 Extract data output signal of master cell
D31 Data output signal name information
NET01
NET02
...

D32 Model connection information of variation detector
xxAND CELL_X1（ .A($$), .B(NET_X00), .Y(NET_X02)）;
xxAND CELL_X2（ .A($$), .B(NET_X02), .Y(NET_X03)）;

S32 Generate circuit

D33 Connection information of variation detector
xxAND CELL_X1（ .A(NET01), .B(NET_X00), .Y(NET_X01)）;
xxAND CELL_X2（ .A(NET02), .B(NET_X02), .Y(NET_X03)）;
......

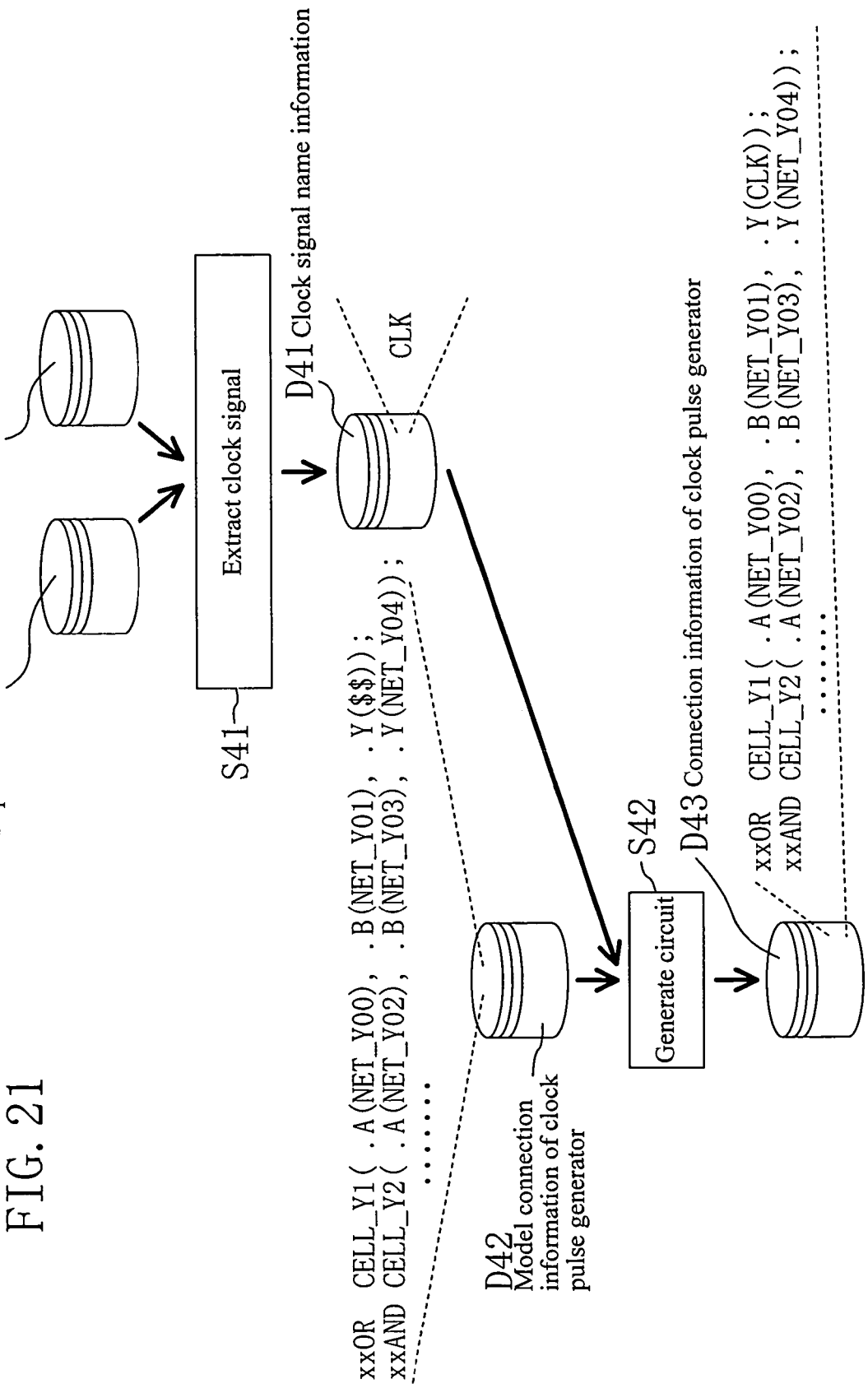

FIG. 22

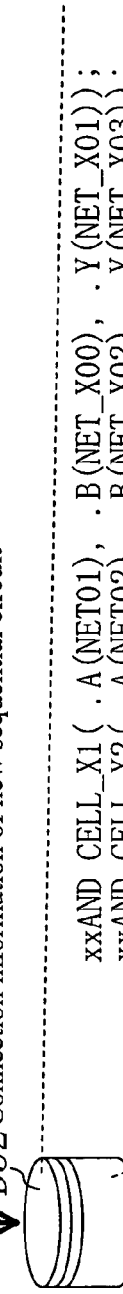

D33 Connection information of variation detector
D43 Connection information of clock pulse generator
S51 Generate difference information
D51 Difference information
D11 Connection information of original sequential circuit
S52 Generate connection information
D52 Connection information of new sequential circuit

```
xxAND  CELL_X1 ( .A(NET01),   .B(NET_X00),  .Y(NET_X01));
xxAND  CELL_X2 ( .A(NET02),   .B(NET_X02),  .Y(NET_X03));
xxOR   CELL_Y1 ( .A(NET_Y00), .B(NET_Y01),  .Y(CLK));
xxAND  CELL_Y2 ( .A(NET_T02), .B(NET_Y03),  .Y(NET_Y04));
      ......
```

```
xxAND  CELL_X1 ( .A(NET01),   .B(NET_X00),  .Y(NET_X01));
xxAND  CELL_X2 ( .A(NET02),   .B(NET_X02),  .Y(NET_X03));
xxOR   CELL_Y1 ( .A(NET_Y00), .B(NET_Y01),  .Y(CLK));
xxAND  CELL_Y2 ( .A(NET_Y02), .B(NET_Y03),  .Y(NET_Y04));
      ......
xxFF   CELL_1  ( .CK(CLK),    .D(NET00),    .Q(NET01));
xxAND  CELL_7  ( .A(NET01),   .B(NET02),    .Y(NET03));
xxFF   CELL_4  ( .CK(CLK),    .D(NET03),    .Q(NET04));
xxFF   CELL_3  ( .CK(CLK),    .D(NET05),    .Q(NET02));
      ......
```

FIG. 23
Original sequential circuit
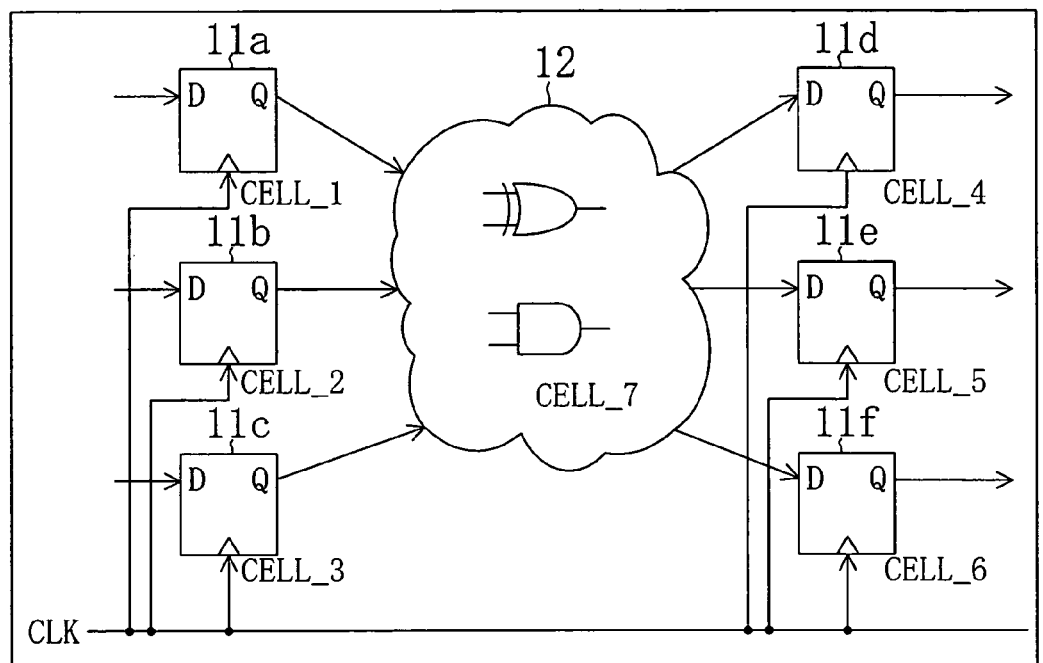
New sequential circuit
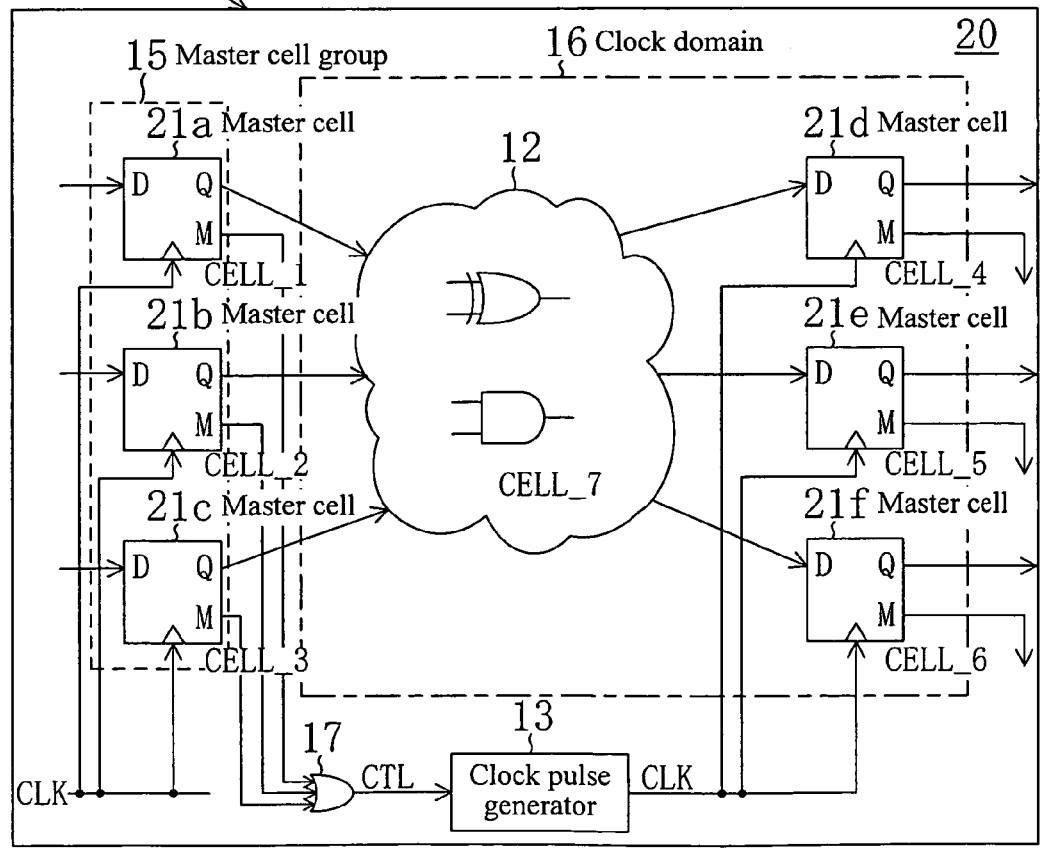

FIG. 26
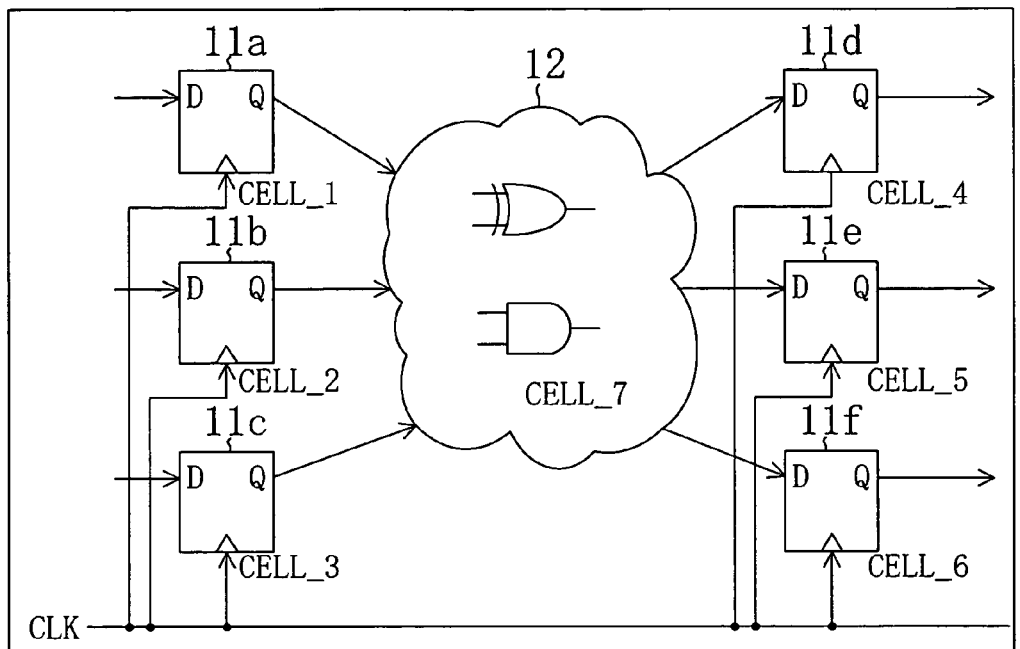
Original sequential circuit
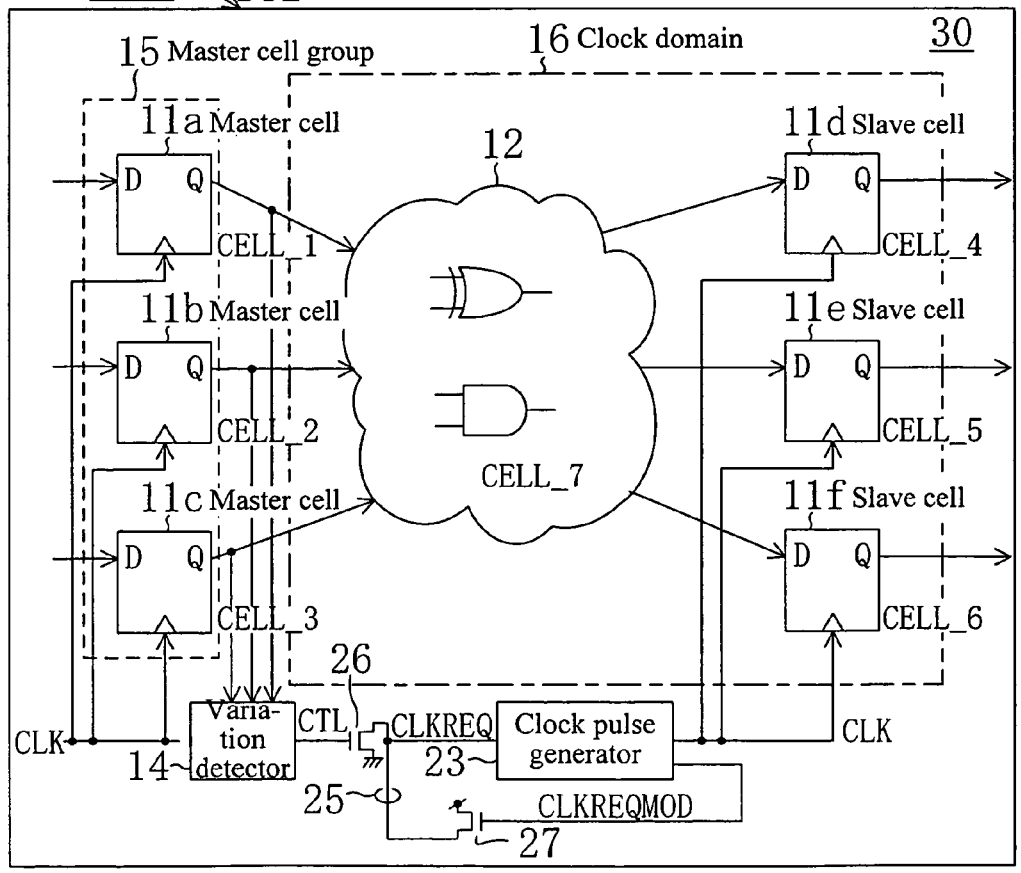
New sequential circuit Replaceable because updating function of memory element is considered to be equivalent.

Replaceable because of being equivalent even if CLK is stopped so long as variation in output of memory element does not affect functions

CLOCK CONTROL IN SEQUENTIAL CIRCUIT FOR LOW-POWER OPERATION AND CIRCUIT CONVERSION TO LOW-POWER SEQUENTIAL CIRCUIT

BACKGROUND OF THE INVENTION

The present invention relates to a clock control technique and a circuit conversion technique for a semiconductor integrated circuit and specifically to a clock control technique for reducing the electric power required for the operation of a sequential circuit and a circuit conversion technique for converting a general sequential circuit to a sequential circuit capable of low-power operation. Furthermore, the present invention relates to a communication device, information reproducing device, image displaying device, and other electronic devices and electronic control devices incorporating a semiconductor integrated circuit having such a low-power sequential circuit, and a movable apparatus including such an electronic control device.

Clock control is one of the methods for realizing low-power operation of a sequential circuit. Conventional clock control techniques can be generally divided into two groups.

FIGS. 34A and 34B illustrate a general concept of a conventional clock control technique. A data control circuit 100 shown in FIG. 34A selects any one of an output of a memory element 11, whose content is updated in synchronization with supplied clock CLK, and supplied data (data input) according to data input selection signal SEL, and the selected data is input to the memory element 11. The content of the memory element 11 is updated at a rising or falling timing of supplied clock CLK. Thus, in view of the function of updating the content of the memory element 11, selection of the output of the memory element 11 by the data control circuit 100 as a new content to be stored is equivalent to no change occurring in clock CLK. Therefore, the circuit structure of FIG. 34A can be replaced with a circuit structure which includes a clock control circuit 101 as shown in FIG. 34B. The clock control circuit 101 controls clock CLK which is to be supplied to the memory element 11 according to data input selection signal SEL. The memory element 11 updates its own content in synchronization with clock CLK (for example, see Japanese Unexamined Patent Publication No. 11-149496).

FIGS. 35A and 35B illustrate a general concept of another conventional clock control technique. Referring to FIG. 35A, it is assumed that the outputs of memory elements 11$a$ and 11$b$ are passed through a combination circuit 12 and input to a memory element 11$c$. The content of the memory element 11$c$ is updated at a rising or falling timing of synchronous clock CLK. Herein, we consider a case where the specifications of the functions of this circuit are such that "the functions of the circuit are not affected even when the contents of the memory elements are not updated for a certain period". In this case, the circuit structure of FIG. 35A can be equivalently replaced with the circuit structure of FIG. 35B wherein the clock control circuit 101 controls supply/stop of clock CLK based on clock control signal CTL (for example, see Japanese Unexamined Patent Publication No. 8-263466).

In general, the specifications of sequential circuits are classified into (a) clock stoppable type and (b) clock unstoppable type. The circuits of type (b) are further generally classified into (b-1) circuits having feedback of the output of a memory element and (b-2) circuits not having feedback of the output of a memory element.

According to the above classification, the conventional technique shown in FIGS. 34A and 34B falls within type (b-1), and the conventional technique shown in FIGS. 35A and 35B falls within type (a). That is, the conventional technique of FIGS. 34A and 34B cannot be realized without the data control circuit 100. The conventional technique of FIGS. 35A and 35B cannot be realized without providing a stop period where the functions of the circuit are not affected even when the operation of the memory element 11$c$ is stopped. Thus, the conventional clock control techniques require the above-described special prerequisite condition, which make clock control of the sequential circuit complicated.

SUMMARY OF THE INVENTION

In view of the above problems, objectives of the present invention is to realize clock control with the assumptions that stop of a clock is impossible due to the specifications, and feedback of the output of a memory element does not exist (this case falls within (b-2) of the above classification), and to realize a sequential circuit capable of low-power operation based on such clock control. Another objective of the present invention is to provide a circuit modifying method for converting a general sequential circuit to a sequential circuit of the present invention and a circuit-designing support system for implementing the circuit modifying method. Still another objective of the present invention is to provide a semiconductor integrated circuit incorporating a sequential circuit of the present invention, a communication device, information reproducing device, image display device, and other electronic devices and controllers including such a semiconductor integrated circuit, and a movable apparatus including such an electronic controller.

A measure taken by the present invention for achieving the above objectives is a sequential circuit comprising: a plurality of memory elements, each of which updates its content in synchronization with a supplied clock (the plurality of memory elements including a memory element which functions as a master cell and a memory element which functions as a slave cell, an input to the slave cell being varied when a content of the master cell is varied); variation detection means which outputs a variation signal when the content of the master cell is varied; and a clock pulse generator for generating a clock pulse based on the variation signal and supplying the clock pulse to the slave cell as the supplied clock.

According to the present invention, a clock pulse is generated by a clock pulse generator according to a variation occurred in the content of a master cell and supplied to a slave cell as a clock.

Herein, the master cell and slave cell are definitions especially supplied for distinguishing memory elements in a sequential circuit of the present invention. This distinguishment is made relatively based on the relationship between inputs and outputs of the memory elements, and therefore, the "master cell" and "slave cell" do not intend to refer to any particular memory element. That is, when any of the memory element is selected as a master cell, a memory element whose input is varied according to a variation in the content of the master cell is referred to as a slave cell.

Thus, in a sequential circuit of the present invention, a clock (clock pulse generated by a clock pulse generator) is supplied to the slave cell only when a variation occurs in the input of the slave cell.

It should be herein noted that each memory element can be a master cell and, on the other hand, can be a slave cell. That is, each memory element is a master cell in the respect that a variation in the content of its own can affect the input of itself or other memory elements and, on the other hand, is a slave cell in the respect that the input of its own is varied according to a variation in the content of itself or other memory element. Thus, a slave cell which received a clock pulse from the clock pulse generator and updated its own content then functions as a master cell. In this way, the contents of the memory elements are varied in a chain-reaction fashion so that supply of the clock to the memory elements is achieved in a chain-reaction fashion entirely over the sequential circuit. With such a structure, the electric current consumption caused by supply of the clock is reduced.

According to the present invention, clock control is performed as if supply of a clock is substantially continued, although supply of the clock is actually stopped. Thus, the operation performed under the prerequisite conditions that stop of the clock is impossible due to the specifications is ensured. Furthermore, the clock supplied to a slave cell is generated based on a variation in the content of a master cell, and feedback of the output of a memory element (slave cell) does not exist. In view of the above, the present invention realizes a sequential circuit capable of low-power operation based on clock control which is performed with the assumptions that stop of the clock is impossible due to the specifications and feedback of the output of a memory element does not exist.

Preferably, the sequential circuit of the present invention comprises: a master cell group including at least one said master cell; and a clock domain including at least one said slave cell whose input is varied when a content of any of the master cells included in the master cell group is varied. Herein, the variation detection means outputs the variation signal when a content of any of the master cells included in the master cell group is varied. The clock pulse generator supplies the clock pulse to all of the slave cells included in the clock domain.

Herein, the clock domain is a definition especially supplied for representing a part or domain of a sequential circuit of the present invention which operates according to a certain clock. That is, a memory element(s) included in a certain clock domain operates in synchronization with a common clock. Conversely speaking, memory elements of different clock domains operate in synchronization with different clocks.

Thus, in a sequential circuit of the present invention, a clock pulse generated by a clock pulse generator is supplied to all of the slave cells included in a clock domain, whereby the circuit structure is optimized. Accordingly, the circuit area and power consumption is further reduced.

Specifically, the variation detection means is a variation detector which determines whether or not the content of the master cell is varied based on an output signal of the master cell and which outputs the variation signal when the variation is detected.

Specifically, the master cell is a memory element having a variation output, the memory element including a variation detection circuit which outputs an original variation signal indicative of a variation occurred in the content of the master cell; and the variation detection means includes the variation detection circuit and outputs the variation signal based on the original variation signal output by the variation detection circuit.

Preferably, the variation detection means in the sequential circuit of the present invention includes a clock pulse generation request signal line for transmitting a request signal which requests the clock pulse generator to generate the clock pulse, the clock pulse generation request signal line changing the request signal to a first logic value when receiving the variation signal output by the variation detection means and changing the request signal to a second logic value when receiving a request update signal. Herein, the clock pulse generator is a clock pulse generator having an update output which generates the clock pulse and the request update signal when the request signal is changed to the first logic value, the request update signal being supplied to the clock pulse generation request signal line.

With such features, congestions in signal lines that transmit variation signals, which occur especially when a plurality of master cells are provided for one clock pulse generator, are avoided. Thus, the effect of reducing the overcrowding of signal lines is achieved.

A memory element which updates its content in synchronization with a supplied clock comprises: a latch circuit which acquires a supplied signal when the supplied clock is changed to a first logic value and which retains the acquired signal as the content of the memory element when the supplied clock is changed to a second logic value; and a variation detection circuit which outputs a variation signal indicative of a variation occurred in the content of the memory element when the input and output of the latch circuit are different and the supplied clock is changed to the first logic value. This memory element can be used as, for example, a component of a sequential circuit of the present invention.

Specifically, the memory element further comprises a master latch circuit which acquires a supplied signal when the supplied clock is changed to the second logic value and which retains the acquired signal when the supplied clock is changed to the first logic value, wherein: the latch circuit is a slave latch circuit for acquiring a signal output from the master latch. Herein, the variation detection circuit includes a first logic element which outputs a predetermined logic value when the input and output of the slave latch circuit are different a delay element for delaying an output of the first logic element, and a second logic element which outputs the variation signal when the output of the delay element is the predetermined logic value and the supplied clock has the first logic value.

Specifically, the variation detection circuit of the memory element includes a basic clock generation circuit for generating a basic clock which has a pulse width shorter than that of the supplied clock based on the supplied clock, a first logic element which outputs a predetermined logic value when the input and output of the latch circuit are different, and a second logic element which outputs the variation signal when an output of the first logic element is the predetermined logic value and the basic clock has the first logic value. Herein, the latch circuit receives the variation signal as the supplied clock.

A clock generation circuit for generating a clock pulse based on a request signal that requests generation of the clock pulse, comprises: a clock pulse generator for generating the clock pulse; and a clock pulse generation request signal line for transmitting the request signal to the clock pulse generator, which changes the request signal to a first logic value when receiving the request signal and which changes the request signal to a second logic value when receiving a request update signal. When the request signal is changed to the first logic value, the clock pulse generator generates the clock pulse and generates the request update signal which is supplied to the clock pulse generation request signal line. This clock generation circuit can be used as, for example, a component of a sequential circuit of the present invention.

Specifically, the clock pulse generator of the clock generation circuit receives an original clock which is the origin of the clock pulse; and the clock pulse generator includes a latch circuit which retains a predetermined logic value in synchronization with the falling of the original clock when the request signal is changed to the first logic value, a first logic element which outputs a positive polarity pulse included in the original clock as the clock pulse when the logic value retained by the latch circuit is the predetermined logic value, and a second logic element which outputs the request update signal in synchronization with the falling of the original clock when the request signal is changed to the first logic value.

Specifically, the clock pulse generator of the clock generation circuit receives an original clock which is the origin of the clock pulse; and the clock pulse generator includes a latch circuit which retains a predetermined logic value in synchronization with the rising of the original clock when the request signal is changed to the first logic value, a first logic element which outputs a negative polarity pulse included in the original clock as the clock pulse when the logic value retained by the latch circuit is the predetermined logic value, and a second logic element which outputs the request update signal in synchronization with the rising of the original clock when the request signal is changed to the first logic value.

Another measure taken by the present invention for achieving the above objectives is a clock control method of a sequential circuit including a plurality of memory elements, each of which updates its content in synchronization with a supplied clock, comprising the steps of: detecting a variation occurred in a content of a memory element included in the plurality of memory elements; and generating a clock pulse when the variation is detected and supplying the clock pulse as the supplied clock to any of the plurality of memory elements whose input is varied when the content of said memory element is varied.

Still another measure taken by the present invention for achieving the above objectives is a circuit modifying method for obtaining connection information of a new sequential circuit based on connection information of an original sequential circuit including a plurality of memory elements, each of which updates its content in synchronization with a supplied clock (the plurality of memory elements including a memory element which functions as a master cell and a memory element which functions as a slave cell, an input to the slave cell being varied when a content of the master cell is varied), the method comprising: a slave cell extraction step of extracting the slave cell from connection information of the original sequential circuit; a master cell group extraction step of extracting, for each extracted slave cell, a master cell group which includes at least one master cell corresponding to the slave cell from the connection information of the original sequential circuit; a variation detection means generation step of generating connection information of variation detection means which outputs a variation signal when a content of any of the master cells included in the extracted master cell group is varied; a clock pulse generator generation step of determining a clock domain so as to include some of the extracted slave cells whose extracted master cell groups are common, extracting a clock which is to be input to the slave cells included in the clock domain from connection information of the original sequential circuit, and generating connection information of a clock pulse generator based on the extracted clock; and a connection information synthesizing step of synthesizing the connection information of the original sequential circuit, the connection information of the variation detection means which is generated at the variation detection means generation step, and the connection information of the clock pulse generator which is generated at the clock pulse generator generation step to obtain connection information of the new sequential circuit. Herein, the clock pulse generator generates a clock pulse as the clock extracted at the clock pulse generator generation step based on a variation signal output from the variation detection means.

Preferably, in the circuit modifying method of the present invention, the variation detection means is a variation detector which determines whether or not the content of the master cell is varied based on an output signal of the master cell and which outputs the variation signal when the variation is detected. At the variation detection means generation step, one or more output signals of the at least one master cell included in the master cell group are extracted from the connection information of the original sequential circuit for each master cell group extracted at the master cell group extraction step, and connection information of the variation detector is generated based on the one or more extracted output signals.

Preferably, in the circuit modifying method of the present invention, the master cell in the new sequential circuit is a memory element having a variation output, the memory element including a variation detection circuit which outputs an original variation signal indicative of a variation occurred in the content of the master cell. The variation detection means includes the variation detection circuit and outputs the variation signal based on the original variation signal output by the variation detection circuit. At the variation detection means generation step, conversion information which is used for converting the at least one master cell included in the master cell group extracted at the master cell group extraction step to the memory element having a variation output is generated as the connection information of the variation detection means.

Preferably, in the circuit modifying method of the present invention, the variation detection means includes a clock pulse generation request signal line for transmitting a request signal which requests the clock pulse generator to generate the clock pulse, the clock pulse generation request signal line changing the request signal to a first logic value when receiving the variation signal output by the variation detection means and changing the request signal to a second logic value when receiving a request update signal. The clock pulse generator is a clock pulse generator having an update output which generates the clock pulse and the request update signal when the request signal is changed to the first logic value, the request update signal being supplied to the clock pulse generation request signal line. The circuit modifying method comprises a clock pulse generator conversion step of generating conversion information used for converting the connection information of the clock pulse generator which is generated at the clock pulse generator generation step to connection information of the clock pulse generator having an update output. At the connection information synthesizing step, the connection information of the original sequential circuit, the connection information of the variation detection means which is generated at the variation detection means generation step, the connection information of the clock pulse generator which is generated at the clock pulse generator generation step, and the conversion information generated at the clock pulse generator conversion step are synthesized to obtain connection information of the new sequential circuit.

Still another measure taken by the present invention for achieving the above objectives is a circuit-designing support system for obtaining connection information of a new sequential circuit based on connection information of an original sequential circuit including a plurality of memory elements, each of which updates its content in synchronization with a supplied clock, the system comprising the steps of the above circuit modifying method.

BRIEF DESCRIPTION OF THE DRAWINGS

FIG. 17 illustrates a general structure of a circuit-designing support system according to embodiment 4 of the present invention.

FIG. 20 is a flowchart of variation detector generation means.

FIG. 21 is a flowchart of clock pulse generator generation means.

FIG. 22 is a flowchart of connection information synthesizing means according to embodiment 4 of the present invention.

FIG. 23 illustrates a general structure of a circuit-designing support system according to embodiment 5 of the present invention.

FIG. 26 illustrates a general structure of a circuit-designing support system according to embodiment 6 of the present invention.

DESCRIPTION OF THE PREFERRED EMBODIMENTS

Hereinafter, embodiments of the present invention will be described with reference to the drawings. It should be noted that lowercase alphabetical letters suffixed to reference numbers are provided for distinguishing a plurality of like components or signals from each other.

Embodiment 1

Figure 1:
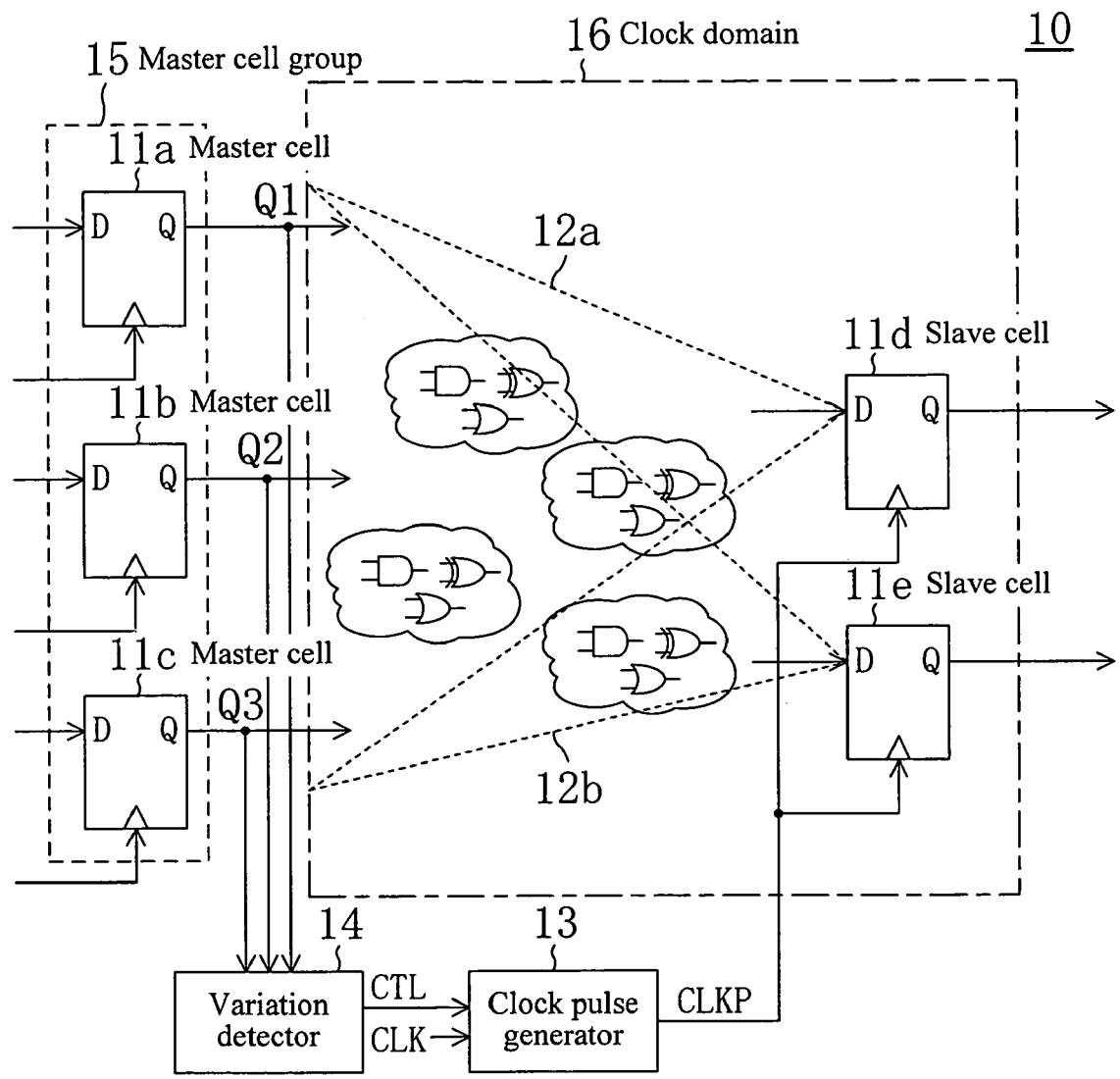
FIG. 1 is a circuit diagram of a sequential circuit according to embodiment 1 of the present invention.

FIG. 1 illustrates a circuit structure of a sequential circuit according to embodiment 1 of the present invention. The sequential circuit 10 of embodiment 1 includes memory elements 11a, 11b, 11c, 11d and 11e (hereinafter, these are generically referred to as "memory elements 11"). Any of the memory elements 11 is selected as a master cell, and a memory element 11 whose content is varied according to a variation in the content of the master cell is referred to as a slave cell. The sequential circuit 10 further includes combinational circuits 12a and 12b, a clock pulse generator 13 for generating clock pulse CLKP as a synchronous clock for the slave cell, and a variation detector 14 for detecting a variation in the content of the master cell.

Herein, for convenience of illustration, it is assumed that the sequential circuit 10 includes the five memory elements 11, three of them (memory elements 11a, 11b, and 11c) being slave cells and the remaining two (memory elements 11d and 11e) being slave cells. In an actual circuit structure, the number of the memory elements 11 included in the sequential circuit 10 may be any number, and any of the memory elements 11 may be selected as a master cell or a slave cell. Furthermore, although the memory elements 11 are D-flip flops in FIG. 1, the memory element of the present invention is not limited thereto. The memory element 11 may be a T-flip flop, a JK-flip flop, or any other element, so long as its content is updated in synchronization with a supplied clock.

The slave cell 11d receives data passed through the combinational circuit 12a which receives the outputs of the master cells 11a, 11b and 11c. Likewise, the slave cell 11e receives data passed through the combinational circuit 12b which receives the outputs of the master cells 11a, 11b and 11c. The output of the master cell may be directly input to the slave cell without passing through a combinational circuit.

The sequential circuit 10 includes a master cell group 15 and a clock domain 16. The master cell group 15 includes the master cells 11a, 11b and 11c. The clock domain 16 includes the slave cell 11d and 11e and the combinational circuits 12a and 12b. The inputs to the slave cell 11d and lie included in the clock domain 16 change according to a variation in the content of any of the master cells 11a, 11b and 11c included in the master cell group 15.

The variation detector 14 determines whether or not a variation has occurred in the content of any of the master cells 11a, 11b and 11c based on outputs Q1, Q2 and Q3 of the master cells 11a, 11b and 11c. If the variation detector 14 detects that a variation has occurred in the content, the variation detector 14 outputs clock control signal CTL (corresponding to a variation signal of the present invention).

Receiving clock control signal CTL, the clock pulse generator 13 generates clock pulse CLKP. On the other hand, the clock pulse generator 13 receives synchronous clock CLK of the sequential circuit 10. The clock pulse generator 13 generates clock pulse CLKP in synchronization with clock CLK. Clock pulse CLKP is supplied as a synchronous clock to the slave cells 11d and 11e included in the clock domain 16.

Figure 2:
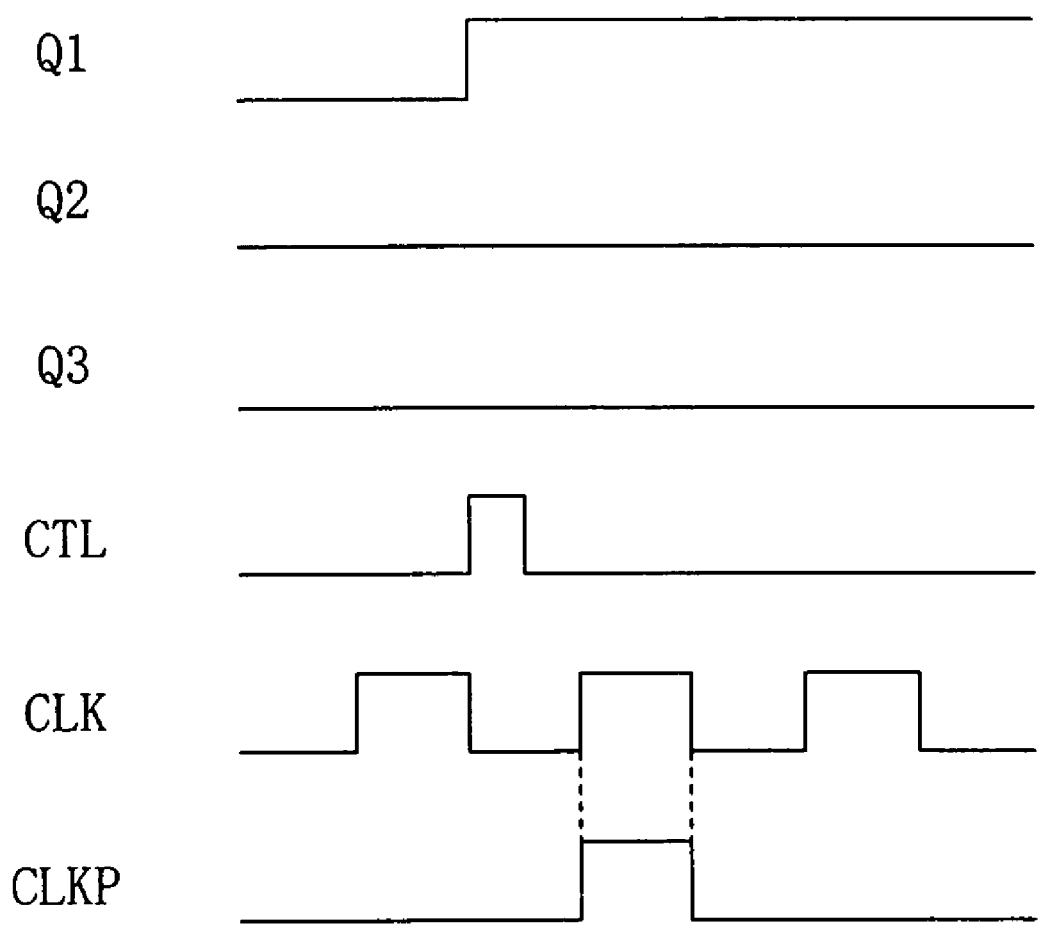
FIG. 2 is a timing chart of the sequential circuit shown in FIG. 1.

Next, the operation of the sequential circuit 10 is described with reference to the timing chart of FIG. 2.

When any of outputs Q1, Q2 and Q3 of the master cells 11a, 11b and 11c is varied, the variation is detected by the variation detector 14 which then outputs clock control signal CTL. Now, consider a case where output Q1 is varied. According to the variation in output Q1, clock control signal CTL is output. The clock pulse generator 13 generates clock pulse CLKP so as to be in synchronization with clock CLK. During a period when clock control signal CTL is not output, i.e., a period when no variation occurs in the outputs of the master cells, clock pulse CLKP is not generated.

As described above, according to embodiment 1, a clock (clock pulse CLKP) is supplied to the memory elements (slave cells) 11 included in the clock domain 16 only when the content of any of the memory elements (master cells) 11 included in the master cell group 15 is varied. Thus, the clock to the slave cells is stopped during a period when no variation occurs in the contents of the master cells, i.e., no variation occurs in the inputs to the slave cells and accordingly the contents are not needed to be updated. The slave cells function as master cells for themselves and/or other slave cells so that supply of the clock to the memory elements 11 is achieved in a chain-reaction fashion entirely over the sequential circuit 10. As a result, clock control is possible with the assumptions that stop of the clock is impossible due to the specifications and feedback of the output of the memory element does not exist. Thus, the electric current consumption caused by supply of the clock is reduced.

Clock pulse CLKP generated by the clock pulse generator 13 is in synchronization with synchronous clock CLK of the sequential circuit 10. Thus, a clock skew in the sequential circuit 10 is assured so that the sequential circuit 10 normally operates as a synchronous sequential circuit.

In the above-described example of embodiment 1, one variation detector 14 is provided to each master cell group 15, but the present invention is not limited thereto. For example, one variation detector may be provided to each master cell, and the logical sum of the outputs of the variation detectors may be supplied as clock control signal CTL to the clock pulse generator 13.

In the above-described example, one clock pulse generator 13 is provided to each clock domain 16, but the present invention is not limited thereto. A plurality of clock pulse generators may be provided to each clock domain 16.

Embodiment 2

Figure 3:
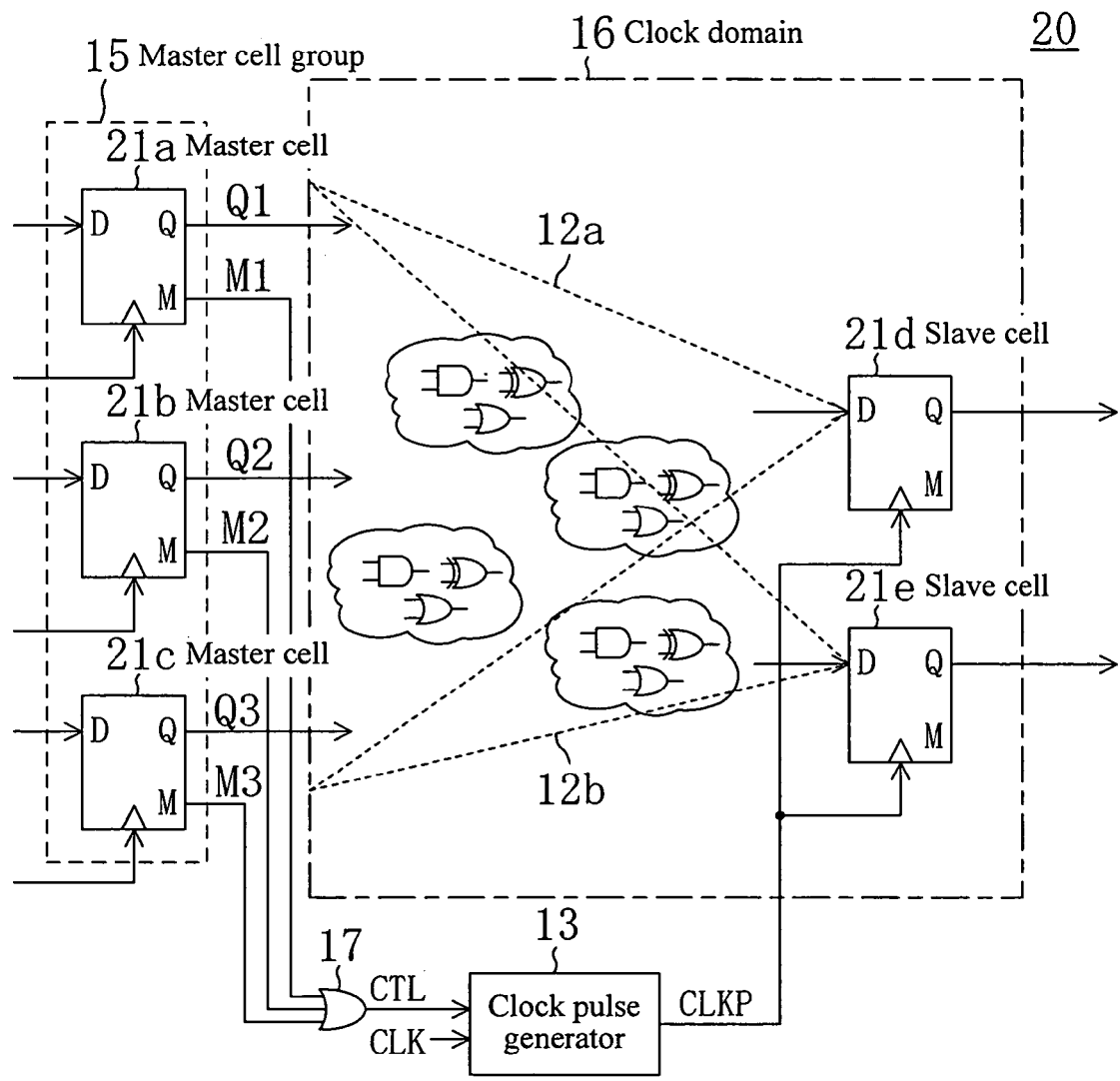
FIG. 3 is a circuit diagram of a sequential circuit according to embodiment 2 of the present invention.

FIG. 3 shows a circuit structure of a sequential circuit according to embodiment 2 of the present invention. The sequential circuit 20 of embodiment 2 includes memory elements 21 each having a variation output in place of the memory elements 11 of the sequential circuit 10 of embodiment 1. From the variation output of each memory element 21, a variation signal indicating that the content of the memory element 21 has been changed is output. (The variation signal corresponds to an original variation signal of the present invention.) Hereinafter, the sequential circuit 20 is described as to only aspects different from the sequential circuit 10. In FIG. 3, like elements and signals are denoted by like reference numerals used in FIG. 1, and detailed descriptions for each of them are omitted.

The sequential circuit 20 includes a logic element 17 in place of the variation detector 14 described in embodiment 1. The logic element 17 receives variation signals M1, M2 and M3 output from master cells 21a, 21b and 21c and outputs the logical sum of these signals as clock control signal CTL (corresponding to a variation signal of the present invention). The clock pulse generator 13 receives clock control signal CTL from the logic element 17.

Figure 4:
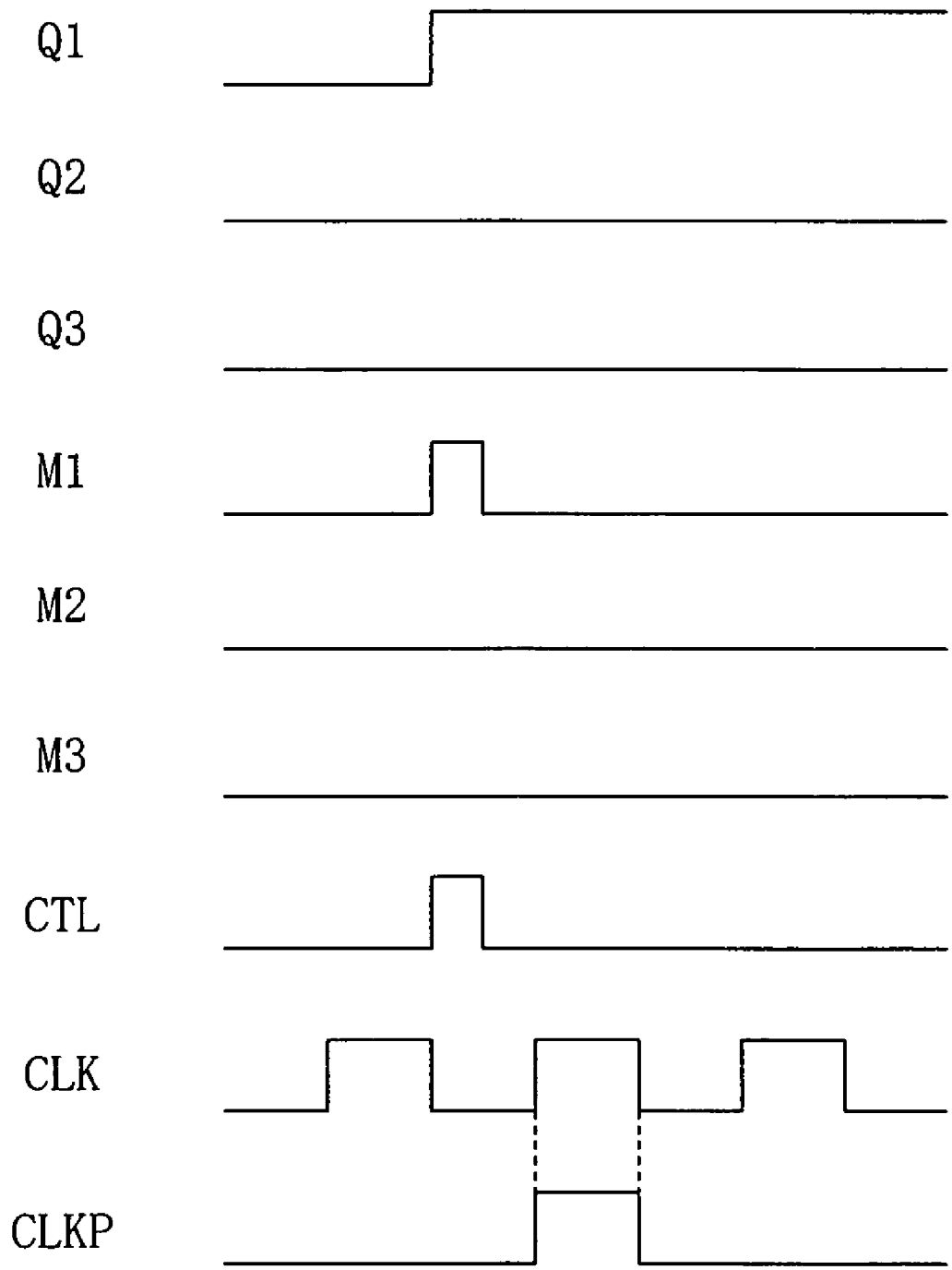
FIG. 4 is a timing chart of the sequential circuit shown in FIG. 3.

Next, the operation of the sequential circuit 20 is described with reference to the timing chart of FIG. 4.

When a variation occurs in the contents of the master cells 21a, 21b and 21c, the master cells 21a, 21b and 21c output variation signals M1, M2 and M3 according to the variations in outputs Q1, Q2 and Q3, respectively. When any of variation signals M1, M2 and M3 is output, clock control signal CTL is output from the logic element 17. Herein, consider a case where variation signal M1 is output from the master cell 21a. The clock pulse generator 13 generates clock pulse CLKP which is in synchronization with clock CLK. During a period when clock control signal CTL is not output, i.e., a period when no variation signal is output from the master cells, clock pulse CLKP is not generated.

Next, a memory element 21A is described as a specific example of the memory elements 21 having a variation output.

Figure 5:
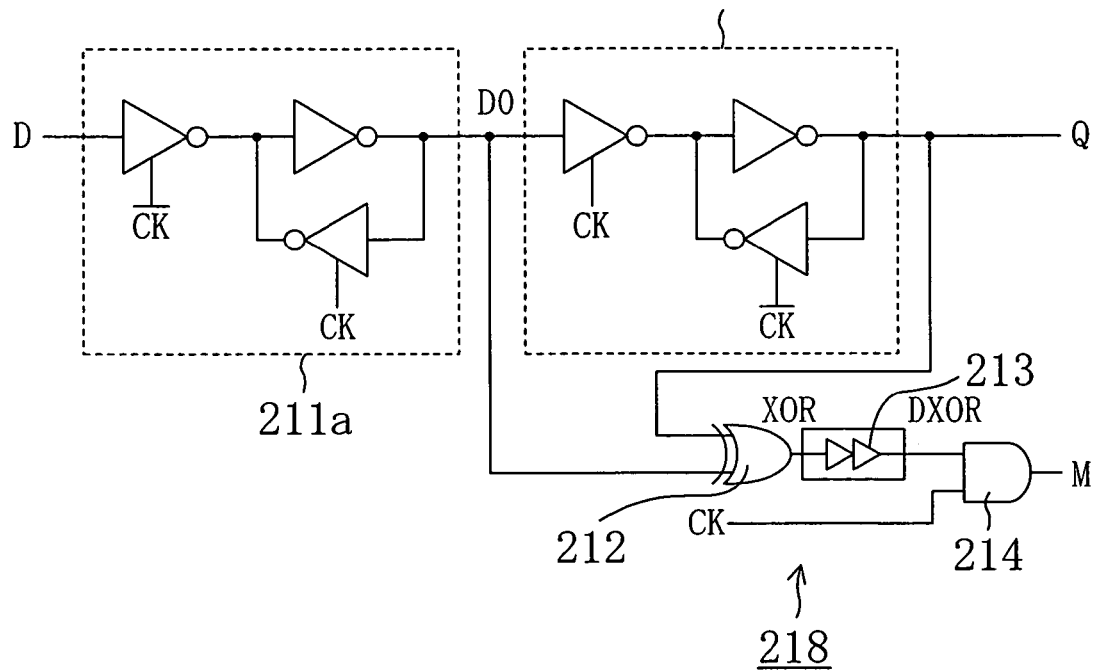
FIG. 5 is a circuit diagram of a memory element in the sequential circuit shown in FIG. 3.

FIG. 5 shows a circuit structure of the memory element 21A. The memory element 21A includes a master latch circuit 211a, a slave latch circuit 211b, a logic element 212 (corresponding to the first logic element of the present invention), a delay element 213, and a logic element 214 (corresponding to the second logic element of the present invention). The master latch circuit 211a acquires and retains signal D supplied to the memory element 21A. The slave latch circuit 211b acquires output DO of the master latch circuit 211a and retains output DO as a content of the memory element 21A. The logic element 212 calculates the exclusive OR of input DO and output Q of the slave latch circuit 211b to output signal XOR. The delay element 213 delays signal XOR to output signal DXOR. The logic element 214 calculates the logical product of signal DXOR and clock CK supplied to the memory element 21A to output variation signal M. It should be noted that part consisting of the logic element 212, the delay element 213 and the logic element 214 corresponds to a variation detecting circuit 218 of the present invention.

Figure 6:
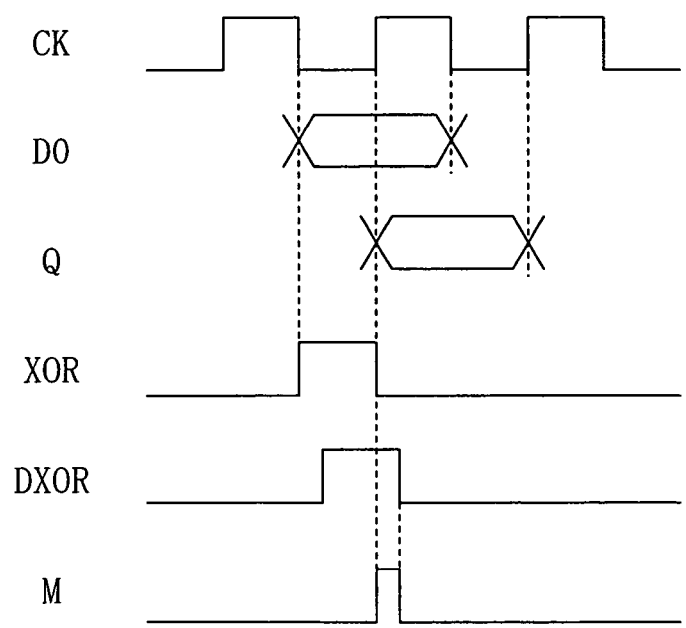
FIG. 6 is a timing chart of the memory element shown in FIG. 5.

The operation of the memory element 21A having the above structure is described with reference to the timing chart of FIG. 6.

When clock CK falls to "L" (corresponding to the second logic value of the present invention), the master latch circuit 211a acquires signal D. When clock CK rises to "H" (corresponding to the first logic value of the present invention), the master latch circuit 211a retains acquired signal D. Thus, the master latch circuit 211a retains the value of signal DO during one period which lasts from a falling edge of clock CK to a next falling edge of clock CK. When clock CK rises to "H", the slave latch circuit 211b acquires output signal DO of the master latch circuit 211a. When clock CK falls to "L", the slave latch circuit 211b retains acquired signal DO.

During a period which starts when clock CK falls to "L" so that the value of signal DO is changed and ends when clock CK rises to "H" so that signal DO is acquired by the slave latch circuit 211b, input DO and output Q of the slave latch circuit 211b have different logic values. Thus, during this period, output XOR of the logic element 212 has a predetermined true logic value (it is assumed herein that the value is "H"). Signal XOR is delayed by the delay element 213, and because of a resultant signal DXOR, this state of the true logic value is maintained till a timing when signal DO is acquired by the slave latch circuit 211b (a timing when clock CK rises to "H"). Then, the logic element 214 calculates the logical product of signal DXOR and clock CK and outputs variation signal M as a result of the calculation.

As described above, the memory element 21A updates the content of its own in synchronization with the rising of supplied clock CK. When the content is varied, the memory element 21A outputs a pulse as variation signal M.

Next, a memory element 21B is described as another specific example of the memory element 21 having a variation output.

Figure 7:
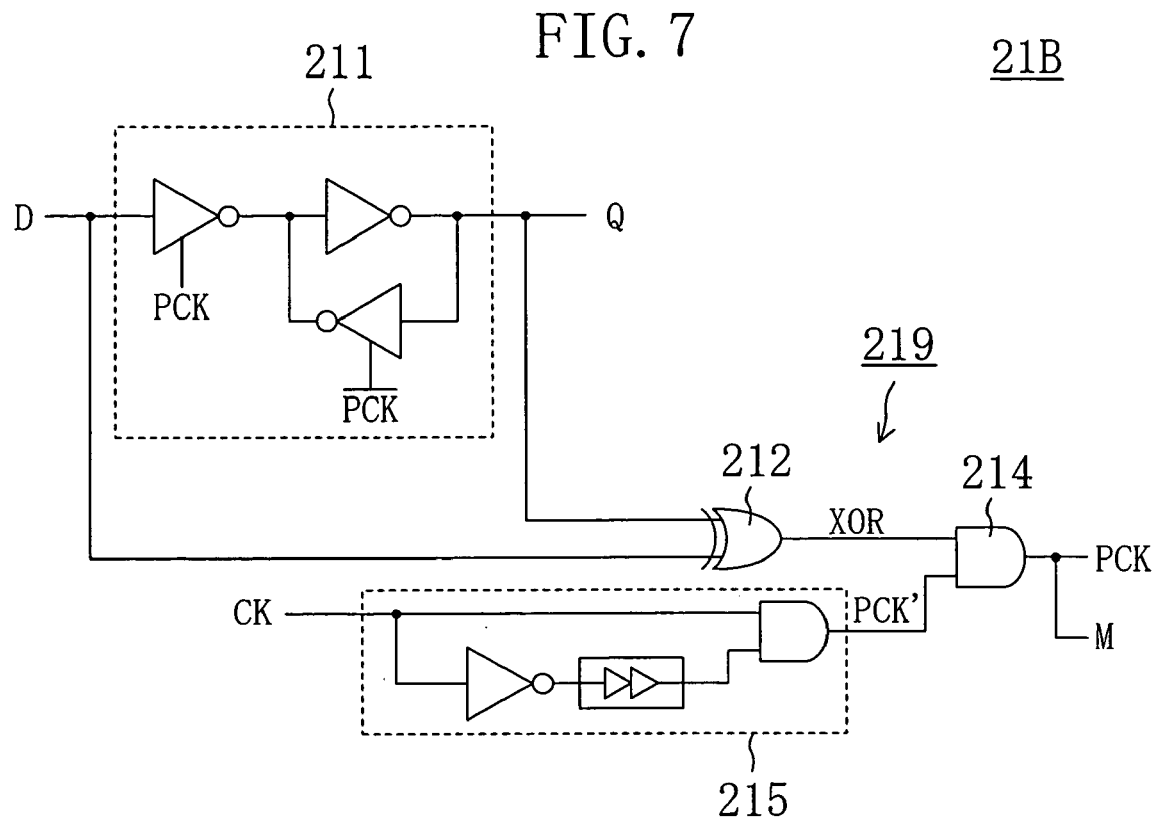
FIG. 7 is another circuit diagram of a memory element in the sequential circuit shown in FIG. 3.

FIG. 7 shows a circuit structure of the memory element 21B. The memory element 21B includes a latch circuit 211, a logic element 212 (corresponding to the first logic element of the present invention), a basic clock generation circuit 215 and a logic element 214 (corresponding to the second logic element of the present invention). The latch circuit 211 acquires and retains signal D supplied to the memory element 21B. The logic element 212 calculates the exclusive OR of input D and output Q of the latch circuit 211 to output signal XOR. The basic clock generation circuit 215 generates from clock CK supplied to the memory element 21B basic clock PCK' so as to have a pulse width shorter than that of clock CK. The logic element 214 calculates the logical product of signal XOR and basic clock PCK' to output variation signal M. Herein, the output of the logic element 214 is also used as clock pulse PCK for controlling the operation of the latch circuit 211. It should be noted that part consisting of the logic element 212, the basic clock generation circuit 215 and the logic element 214 corresponds to a variation detecting circuit 219 of the present invention.

Figure 8:
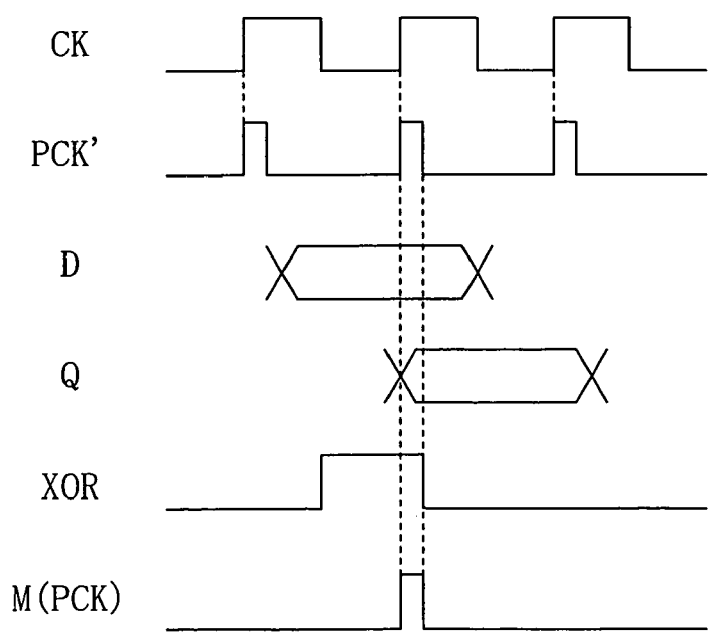
FIG. 8 is a timing chart of the memory element shown in FIG. 7.

The operation of the memory element 21B having the above structure is described with reference to the timing chart of FIG. 8.

When clock pulse PCK rises to "H" (corresponding to the first logic value of the present invention), the latch circuit 211 acquires signal D. When clock pulse PCK falls to "L" (corresponding to the second logic value of the present invention), the latch circuit 211 retains acquired signal D. Thus, input D and output Q of the latch circuit 211 have different logic values during a period which starts when the value of signal D is changed and ends when clock CK rises to "H" so that signal D is acquired by the latch circuit 211. Thus, during this period, output XOR of the logic element 212 has a predetermined true logic value (it is assumed herein that the value is "H"). Further, the basic clock generation circuit 215 outputs basic clock PCK'. Then, the logic element 214 calculates the logical product of signal XOR and basic clock PCK' and outputs variation signal M of the true logic value and clock pulse PCK as a result of the calculation.

When clock pulse PCK becomes the true logic value ("H"), signal D is acquired by the latch circuit 211 so that input D and output Q of the latch circuit 211 have the same logic value. Accordingly, output XOR of the logic element 212 results in a false logic value (it is assumed herein that the value is "L"), and variation signal M and clock pulse PCK output from the logic element 214 also result in a false logic value ("L").

As described above, the memory element 21B updates the content of its own in synchronization with the rising of supplied clock CK. When the content is varied, the memory element 21B outputs variation signal M having a predetermined pulse width. The variation signal M has a sufficient on-duty period as a latch retaining pulse in the memory element 21B. In the memory element 21B, variation signal M is used as the latch retaining pulse (clock pulse PCK), and therefore, it is possible to secure the least necessary latch retaining pulse width.

As described above, according to embodiment 2, with a memory element having a variation output, it is possible to readily detect a variation in the content of a master cell included in a master cell group. Furthermore, it is possible to simplify a circuit for detecting a variation in the content of the master cell.

The memory elements 21A and 21B which have been described as specific examples of the memory element 21 having a variation output are merely examples, and the present invention is not limited thereto. Any other various circuit structures can be realized as the memory element 21 having a variation output within the scope of the present invention. For example, a memory element having a variation output, which updates the content of its own in synchronization with the falling of a supplied clock, can be realized with the above-described circuit structure. In this case, the first and second logic values are replaced with "L" and "H", respectively.

Embodiment 3

In the sequential circuits 10 and 20 of embodiments 1 and 2, if a plurality of master cells are included in a master cell group, the number of output signals Q and the number of variation signals M are increased, and accordingly, congestions are caused in the signal line for transmitting a variation occurred in the content of a master cell to a clock pulse generator. Embodiment 3 of the present invention realizes a circuit structure which avoids the overcrowding of signal lines.

A clock generation circuit of embodiment 3 is now described before the explanation of a sequential circuit of embodiment 3.

Figure 9:
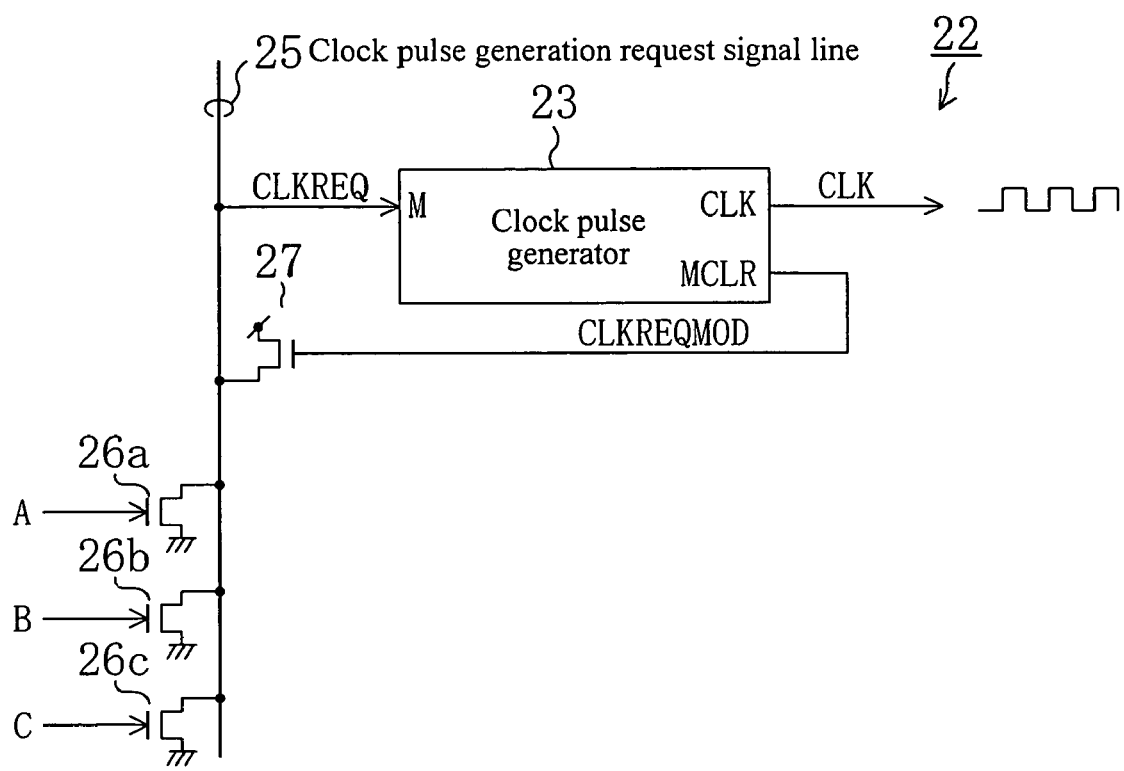
FIG. 9 is a circuit diagram of a clock pulse generation circuit according to embodiment 3 of the present invention.

FIG. 9 shows a circuit structure of the clock generation circuit of embodiment 3. The clock generation circuit 22 includes a clock pulse generator 23 for generating clock pulse CLK and a clock pulse generation request signal line 25 for transmitting request signal CLKREQ which requests the clock pulse generator 23 to generate a clock pulse.

The clock pulse generation request signal line 25 is connected through an open drain buffer 26 to a circuit (request issuance circuit) which issues request signal CLKREQ and receives a request issuance signal from the request issuance circuit. In the example of FIG. 9, the clock pulse generation request signal line 25 is connected to three request issuance circuits which issue request issuance signals A, B and C. The request issuance circuit corresponds to the variation detector 14 in the sequential circuit 10 of embodiment 1 and the memory element 21 having a variation output in the sequential circuit 20 of embodiment 2. The request issuance signal corresponds to the clock control signal output by the variation detector 14 and the variation signal output by the memory element 21 having a variation output.

The clock pulse generation request signal line 25 is directly connected to the clock pulse generator 23 and supplies request signal CLKREQ to the clock pulse generator 23. The clock pulse generation request signal line 25 is further connected to the clock pulse generator 23 through an open drain buffer 27 and receives request update signal CLKREQMOD from the clock pulse generator 23.

The clock pulse generator 23 is a clock pulse generator having an update output. When request signal CLKREQ has the first logic value which requests generation of a clock pulse, the clock pulse generator 23 having the update output generates clock pulse CLK and outputs request update signal CLKREQMOD to the clock pulse generation request signal line 25.

Figure 10:
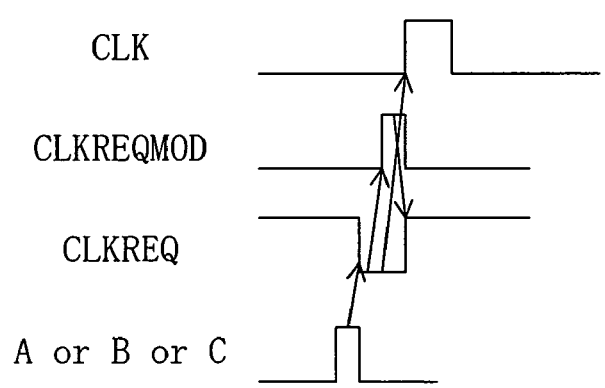
FIG. 10 is a timing chart of the clock pulse generation circuit shown in FIG. 9.

Next, the operation of the clock generation circuit 22 is described with reference to the timing chart of FIG. 10.

When the clock pulse generation request signal line 25 receives any of request issuance signals A, B and C, the voltage of the clock pulse generation request signal line 25 becomes "L" level voltage. As a result, request signal CLKREQ has the first logic value which requests generation of a clock pulse. When request signal CLKREQ has the first logic value, clock pulse CLK is output. At the same timing, request update signal CLKREQMOD is output. Receiving request update signal CLKREQMOD, the voltage of the clock pulse generation request signal line 25 becomes "H" level voltage. That is, the clock pulse generation request signal line 25 recovers the stationary state. Thus, request signal CLKREQ has the second logic value which cancels the request for generation of a clock pulse.

Next, a clock pulse generator 23A is described as a specific example of the clock pulse generator 23 having an update output.

Figure 11:
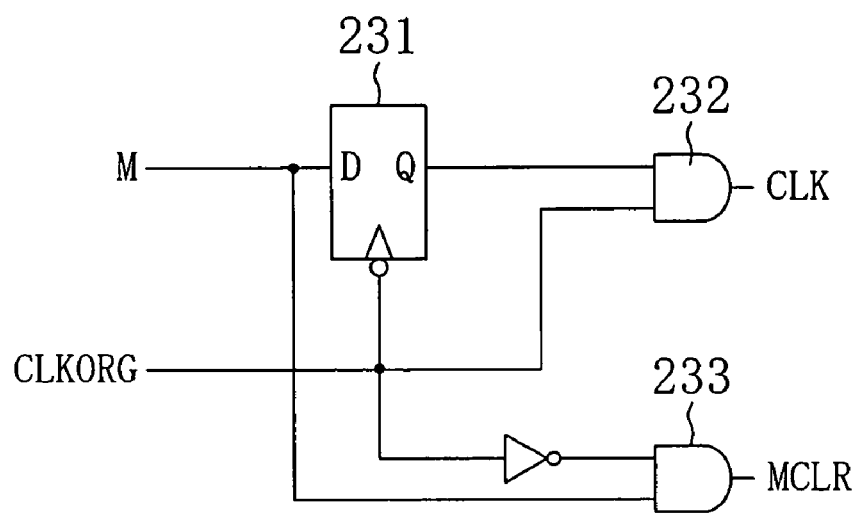
FIG. 11 is a circuit diagram of the clock pulse generation circuit shown in FIG. 9.

FIG. 11 shows a circuit structure of the clock pulse generator 23A. The clock pulse generator 23A includes a latch circuit 231, a logic element 232 (corresponding to the first logic element of the present invention) and a logic element 233 (corresponding to the second logic element of the present invention). The latch circuit 231 acquires request signal M, which is supplied at a terminal M, in synchronization with the falling of original clock CLKORG supplied at a terminal CLKORG. The logic element 232 calculates a logical product of output Q of the latch circuit 231 and original clock CLKORG to output clock pulse CLK from a terminal CLK. The logic element 233 calculates a logical product of the inversion of original clock CLKORG and signal M to output request update signal MCLR from a terminal MCLR.

Figure 12:
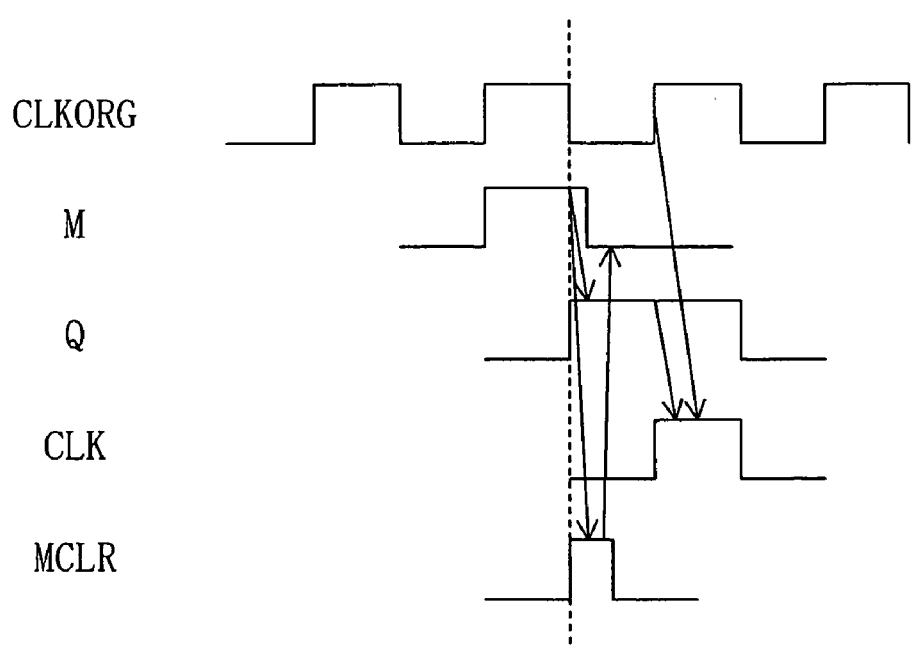
FIG. 12 is a timing chart of the clock pulse generation circuit shown in FIG. 11.

The operation of the clock pulse generator 23A having the above-described structure is described with reference to the timing chart of FIG. 12.

When request signal M is at "H" level (corresponding to the first logic value of the present invention), request signal M is acquired by the latch circuit 231 in synchronization with the falling of original clock CLKORG. At the same timing, the logic element 233 outputs request update signal MCLR. As a result, request signal M recovers "L" level (corresponding to the second logic value of the present invention). Even if request signal M turns to "L" level, output Q of the latch circuit 231 is maintained for one cycle. That is, the latch circuit 231 maintains for one cycle a predetermined logic value obtained based on the state where request signal M is at "H" level (herein, the predetermined logic value is "H"). Then, the logic element 232 calculates a logical product of output Q of the latch circuit 231 and original clock CLKORG to output clock pulse CLK of positive polarity in synchronization with original clock CLKORG.

As described above, the clock pulse generator 23A outputs a pulse of positive polarity as clock pulse CLK in synchronization with the falling of supplied original clock CLKORG and, on the other hand, outputs request update signal MCLR.

Next, a clock pulse generator 23B is described as another specific example of the clock pulse generator 23 having an update output.

Figure 13:
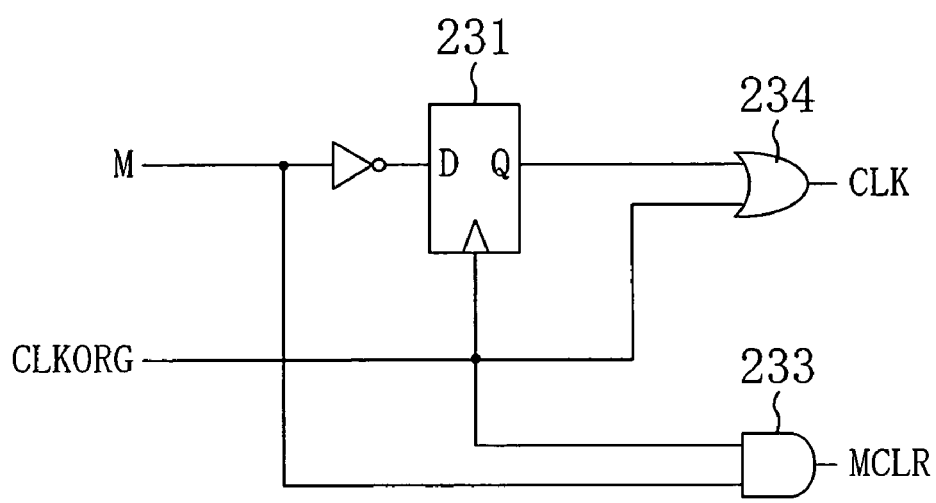
FIG. 13 is another circuit diagram of the clock pulse generation circuit shown in FIG. 9.

FIG. 13 shows a circuit structure of the clock pulse generator 23B. The clock pulse generator 23B includes a latch circuit 231, a logic element 234 (corresponding to the first logic element of the present invention) and a logic element 233 (corresponding to the second logic element of the present invention). The latch circuit 231 acquires an inversion signal of request signal M, which is supplied at a terminal M, in synchronization with the rising of original clock CLKORG supplied at a terminal CLKORG. The logic element 234 calculates a logical sum of output Q of the latch circuit 231 and original clock CLKORG to output clock pulse CLK from a terminal CLK. The logic element 233 calculates a logical product of original clock CLKORG and signal M to output request update signal MCLR from a terminal MCLR.

Figure 14:
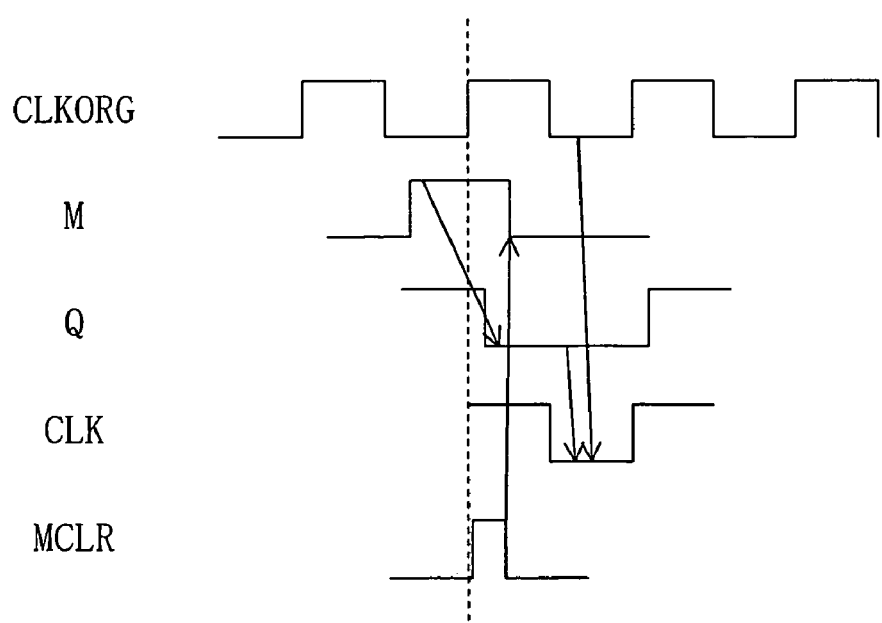
FIG. 14 is a timing chart of the clock pulse generation circuit shown in FIG. 13.

The operation of the clock pulse generator 23B having the above-described structure is described with reference to the timing chart of FIG. 14.

When request signal M is at "H" level (corresponding to the first logic value of the present invention), the inversion signal of request signal M is acquired by the latch circuit 231 in synchronization with the rising of original clock CLKORG. At the same timing, the logic element 233 outputs request update signal MCLR. As a result, request signal M recovers "L" level (corresponding to the second logic value of the present invention). Even if request signal M turns to "L" level, output Q of the latch circuit 231 is maintained for one cycle. That is, the latch circuit 231 maintains for one cycle a predetermined logic value obtained based on the state where request signal M is at "H" level (herein, the predetermined logic value is "L"). Then, the logic element 234 calculates a logical sum of output Q of the latch circuit 231 and original clock CLKORG to output clock pulse CLK of negative polarity in synchronization with original clock CLKORG.

As described above, the clock pulse generator 23B outputs a pulse of negative polarity as clock pulse CLK in synchronization with the rising of supplied original clock CLKORG and, on the other hand, outputs request update signal MCLR.

Next, a sequential circuit of embodiment 3 which includes the above-described clock generation circuit is described.

Figure 15:
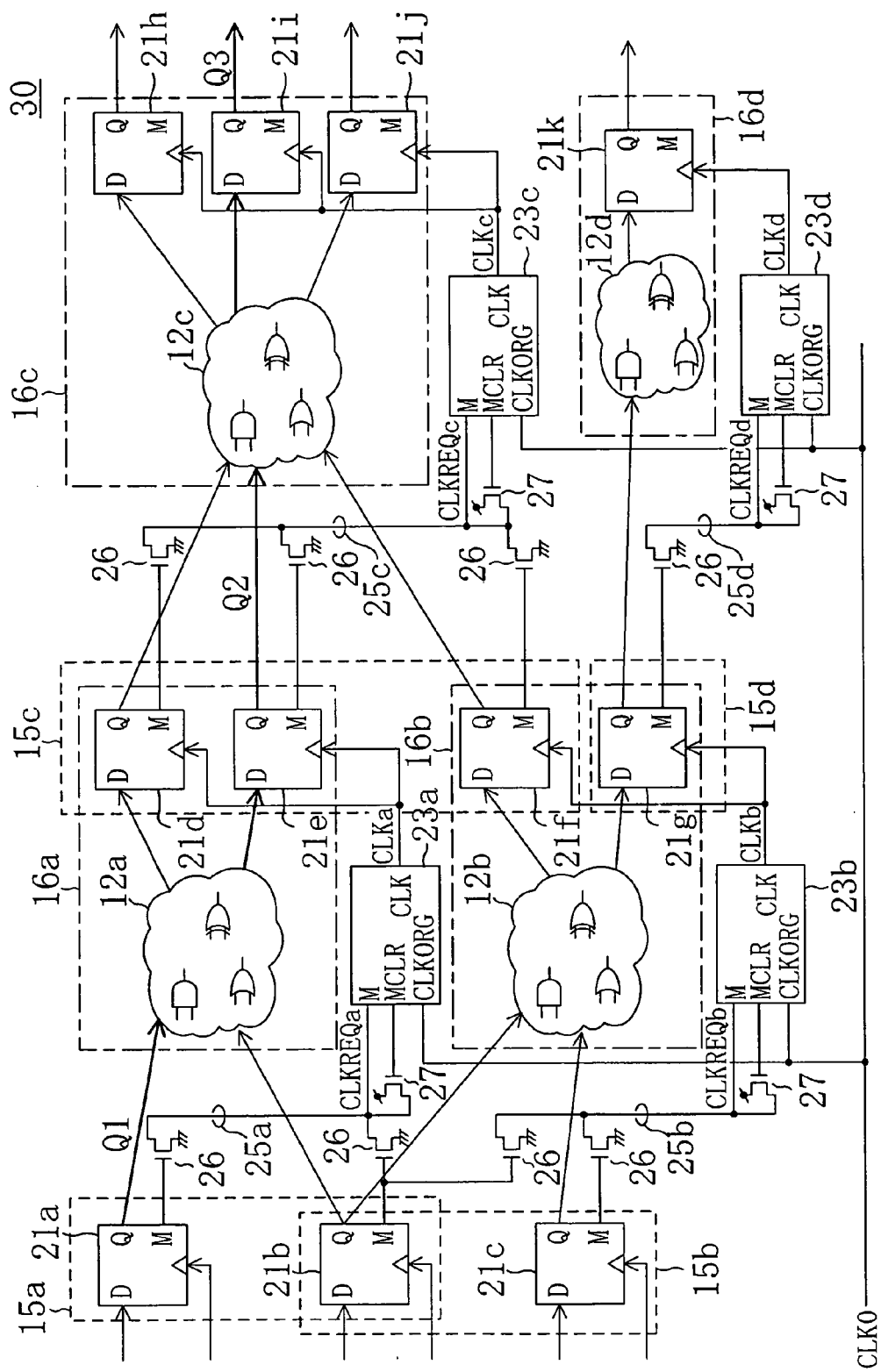
FIG. 15 is a circuit diagram of a sequential circuit according to embodiment 3 of the present invention.

FIG. 15 shows a circuit structure of the sequential circuit of embodiment 3. The sequential circuit 30 of embodiment 3 includes the memory elements 21 each having a variation output, which have been described in embodiment 2 as memory elements. The sequential circuit 30 further includes a clock pulse generation request signal line 25 and the above-described clock pulse generator 23 having an update output as a clock pulse generator. FIG. 15 shows four process blocks, each of which includes a master cell group 15, a clock domain 16, a clock pulse generator 23, and a clock pulse generation request signal line 25. Lowercase alphabetical letters "a" to "d" suffixed to reference numbers indicate the process blocks in which they are included. The structure of the sequential circuit 30 is as already described and, therefore, descriptions thereof are herein omitted.

Figure 16:
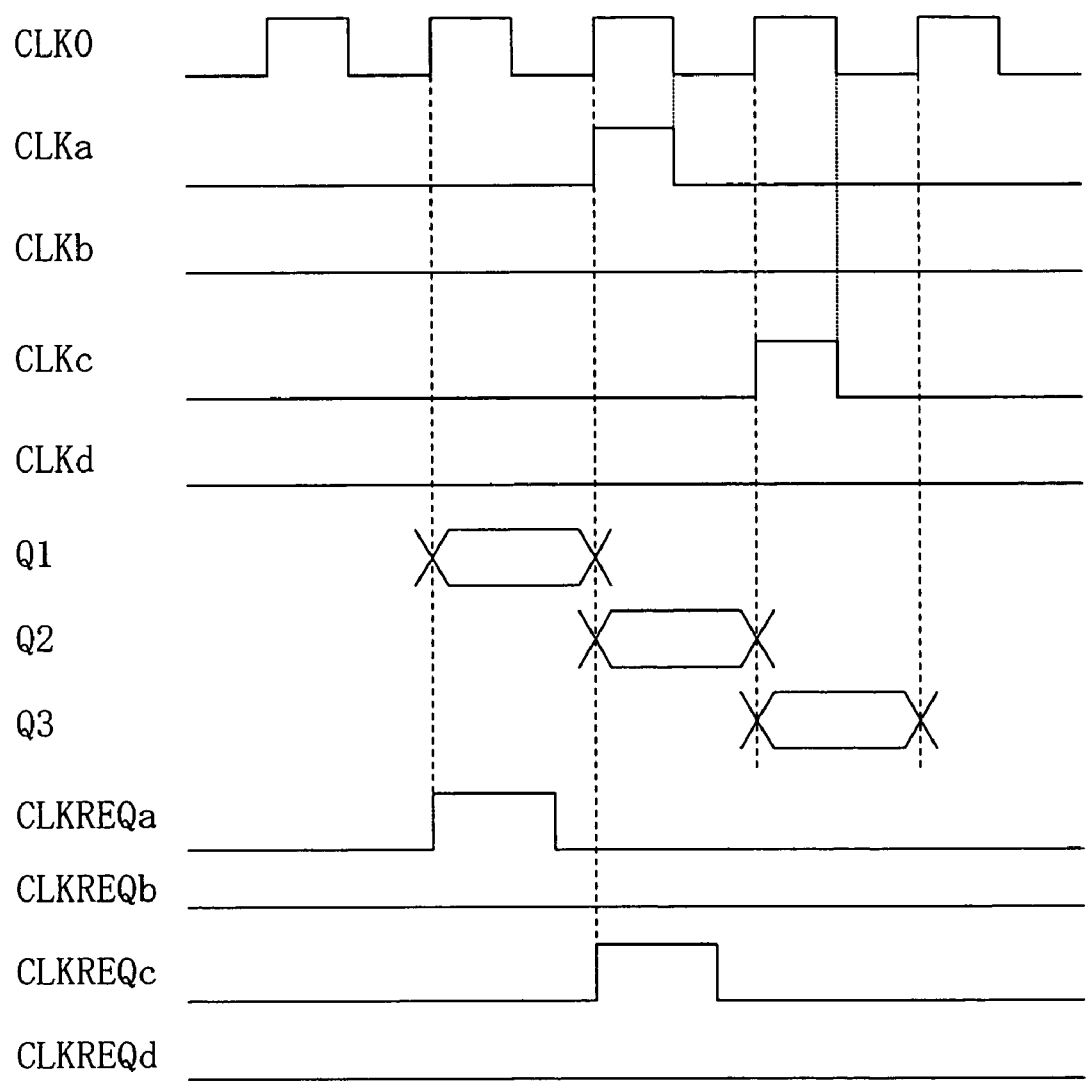
FIG. 16 is a timing chart of the sequential circuit shown in FIG. 16.

Next, the operation of the sequential circuit 30 is described with reference to the timing chart of FIG. 16. Herein, it is assumed that the content of the memory element 21a is changed. The outputs of the memory elements 21a, 21e and 21i are indicated by Q1, Q2 and Q3.

ClockCLK0 is a synchronous clock of the sequential circuit 30. First, the content of the memory element 21a is varied at a certain timing (Q1). At this point in time, the memory element 21a outputs a variation signal to a clock pulse generation request signal line 25a, and request signal CLKREQa becomes the true logic value (shown as "H" in FIG. 15). As a result, clock pulse CLKa is output from a clock pulse generator 23a. Clock pulse CLKa is supplied to the memory element 21e included in the clock domain 16a. The memory element 21e updates its content in synchronization with clock pulse CLKa (Q2). Assuming that the memory element 21a is a master cell, the memory element 21e is a slave cell.

Then, a variation signal is output from the memory element 21e to a clock pulse generation request signal line 25c, and request signal CLKREQc has a true logic value (shown as "H" in FIG. 15). As a result, clock pulse CLKc is output from a clock pulse generator 23c. Clock pulse CLKc is supplied to the memory element 21i included in the clock domain 16c. The memory element 21i updates its content in synchronization with clock pulse CLKc (Q3). Assuming that the memory element 21e is a master cell, the memory element 21i is a slave cell.

As described above, the contents of the memory elements are varied in the sequential circuit in a chain-reaction fashion, and accordingly, the clock is supplied to only a memory element whose input has been varied. In the above example, clock pulses CLKa and CLKc are supplied to the memory elements 21e and 21i, respectively, when a change occurs in the inputs to the memory elements 21e and 21i. However, the inputs to the memory elements included in the clock domains 16b and 16d are not changed. Thus, clock pulses CLKb and CLKd are not supplied. In this way, a clock to a memory element whose input is not varied is stopped, whereby the power consumption by an unnecessary clock is reduced.

As described above, according to embodiment 3, a clock pulse generation request signal line for requesting a clock pulse generator to generate a clock pulse is provided, whereby congestions in signal lines that transmit variation signals output from respective master cells, which occur especially when one master cell group includes a plurality of master cells, are avoided. This structure of embodiment 3 provides the effect of reducing the overcrowding of signal lines in an actual LSI device.

The clock pulse generator of embodiment 3 can output both a clock pulse of positive polarity and a clock pulse of negative polarity. In general, a clock-synchronized system is designed based on any of a clock pulse of positive polarity and a clock pulse of negative polarity. The present invention is applicable to both types of clock-synchronized systems.

It should be noted that the clock pulse generators 23A and 23B described as specific examples of the clock pulse generator 23 having an update output are merely examples, but the present invention is not limited thereto. Other various circuit structures are possible as the clock pulse generator 23 having an update output within the scope of the present invention.

The sequential circuit described in embodiment 3 includes the memory element having a variation output which has been described in embodiment 2, but the above-described effects of embodiment 3 can be achieved even when a general memory element is used.

Embodiment 4

FIG. 17 shows a general structure of a circuit-designing support system according to embodiment 4 of the present invention. The circuit-designing support system 110 of embodiment 4 obtains connection information D52 of a new sequential circuit based on connection information D11 of an original sequential circuit which includes a plurality of memory elements which update their contents in synchronization with a supplied clock. Herein, the new sequential circuit is the sequential circuit 10 of embodiment 1. The circuit-designing support system 110 includes slave cell extraction means, master cell group extraction means, variation detection means-generation means, clock pulse generator generation means, and connection information synthesizing means. Hereinafter, these means are sequentially described.

Figure 18:
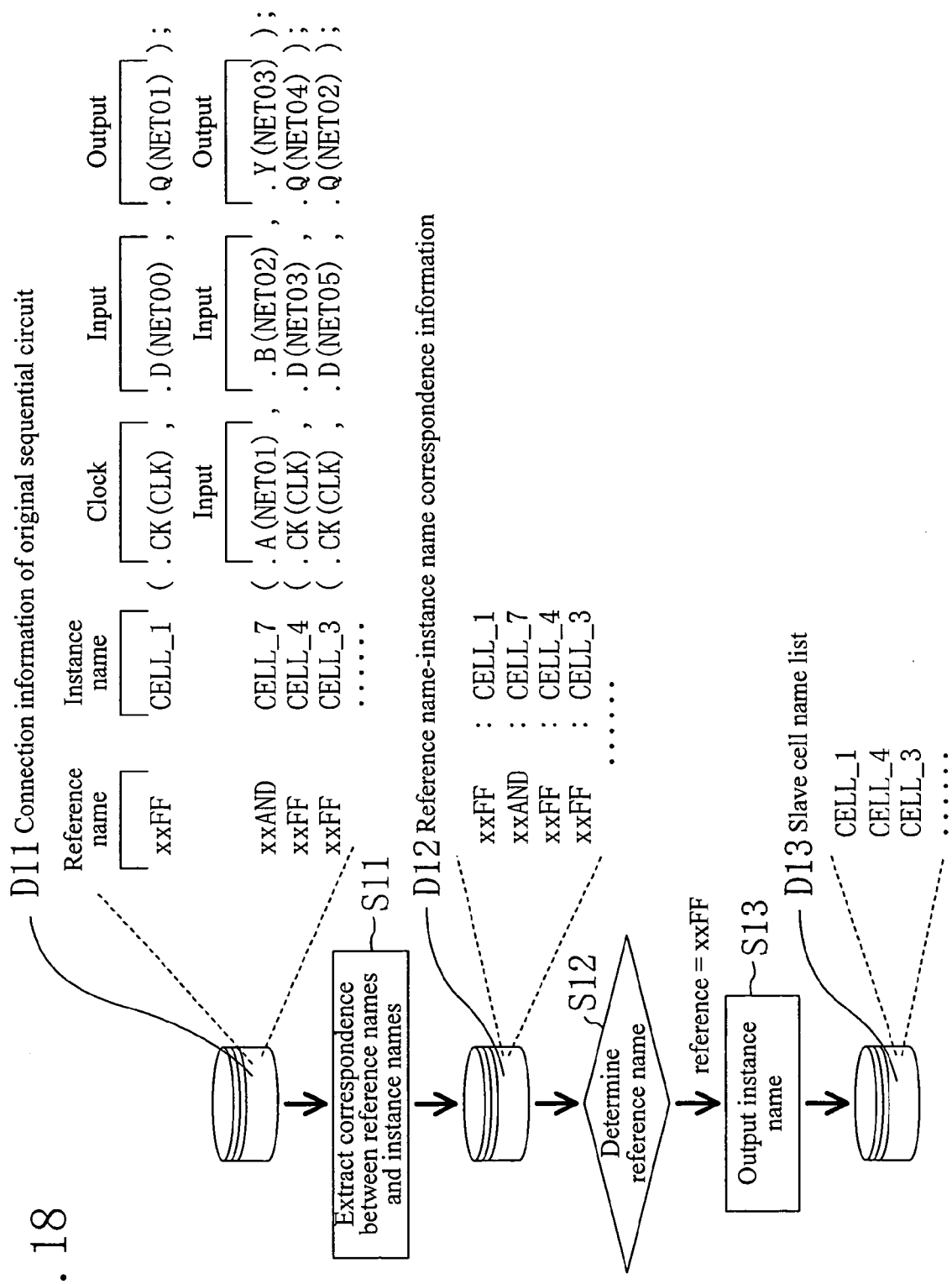
FIG. 18 is a flowchart of slave cell extraction means.

FIG. 18 shows a process flow of the slave cell extraction means. First, the correspondence between reference names and instance names is extracted from the connection information D11 of the original sequential circuit. Herein, the reference name means an identifier which indicates the type of a logic element ("xxAND", "xxOR", "xxFF", or the like). The instance name means an identifier for distinguishing logic elements in circuit connection information ("CELL_1 ", or the like). The indication "CELL_1 " and the other instance names shown in FIG. 17 correspond to logic elements shown in the circuit diagram of FIG. 17. At step S11, the correspondence between the reference names and the instance names of a logic elements which are constituents of the connection information D11 is registered in a database (reference name-instance name correspondence information D12). Next, it is determined whether or not each of the reference names of the logic elements indicates a memory element ("xxFF") (S12). The instance names of the logic elements which have been determined to be memory elements at step S12 are output as the instance names of cells which are to be slave cells of the new sequential circuit (S13). According to the above procedure, a slave cell name list D13 is generated.

Figure 19:
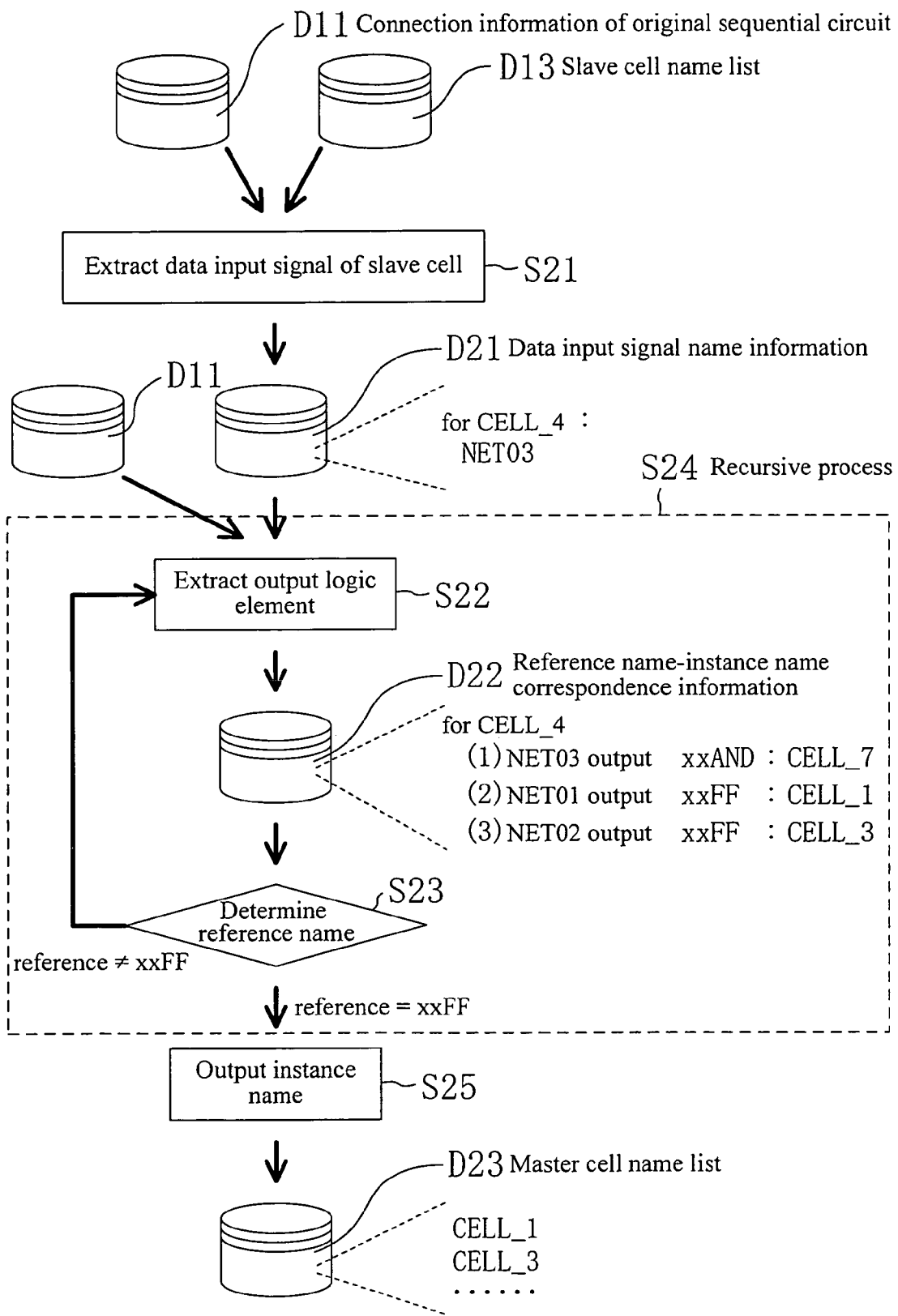
FIG. 19 is a flowchart of master cell group extraction means.

FIG. 19 shows the process flow of the master cell group extraction means. First, for each slave cell included in the slave cell name list D13, a data input signal name written in the connection information D11 of the original sequential circuit is extracted based on the instance name of the slave cell to generate data input signal name information D21 (S21). A logic element whose output is a signal included in the data input signal name information D21 is then extracted from the connection information D11 to generate reference name-instance name correspondence information D22 (S22). Then, it is determined whether or not the reference name of the logic element included in the reference name-instance name correspondence information D22 indicates a memory element ("xxFF") (S23). If it is determined that the reference name does not indicate a memory element, the input signal name of the logic element is extracted, and steps S22 and S23 are performed recursively (S24). In the last, the instance names of the logic elements which have been determined to be memory elements at step S23 are output as the instance names of cells which are to be master cells of the new sequential circuit (S25). According to the above procedure, a master cell name list D23 which represents a master cell group is generated.

FIG. 20 shows the process flow of the variation detection means-generation means. First, for each master cell group, data output signals of all of the memory elements included in the master cell group are extracted based on the connection information D11 of the original sequential circuit and the master cell name list D23 to generate data output signal name information D31 (S31). Then, connection information D33 of a variation detector (variation detection means) is generated using model connection information D32 of the variation detector (S32). In the model connection information D32, a symbol which indicates signal connection (e.g., "$$") is defined. By replacing this indication with a data output signal included in the data output signal name information D31, the connection information D33 of the variation detector is generated.

FIG. 21 shows the process flow of the clock pulse generator generation means. First, for each clock domain, clock signals of all of the memory elements included in the clock domain are extracted based on the connection information D11 of the original sequential circuit and the slave cell name list D13 to generate clock signal name information D41 (S41). Among the slave cells included in the slave cell name list D13, cells of the same master cell group included in the master cell name list D23 belong to the same clock domain in the new sequential circuit. Next, connection information D43 of the clock pulse generator is generated using the model connection information D42 of the clock pulse generator (S42). In the model connection information D42, a symbol which indicates signal connection (e.g., "$$") is defined. By replacing this indication with a clock signal included in the clock signal name information D41, the connection information D43 of the clock pulse generator is generated.

FIG. 22 shows the process flow of the connection information synthesizing means. First, difference information D51 which is to be added to the connection information D11 of the original sequential circuit is generated, from the connection information D33 of the variation detector and the connection information D43 of the clock pulse generator (S51). Then, the connection information D11 and the difference information D51 are synthesized to generate connection information D52 of the new sequential circuit (S52).

As described above, according to embodiment 4, it is possible to readily convert, with a reduced number of steps, a general sequential circuit to a sequential circuit (new sequential circuit) of the present invention which has a clock pulse generator.

Embodiment 5

FIG. 23 shows a general structure of a circuit-designing support system according to embodiment 5 of the present invention. The circuit-designing support system 120 of embodiment 5 obtains connection information D52 of a new sequential circuit based on connection information D11 of an original sequential circuit which includes a plurality of memory elements which update their contents in synchronization with a supplied clock. Herein, the new sequential circuit is the sequential circuit 20 of embodiment 2.

Variation detection means-generation means included in the circuit-designing support system 120 converts a general memory element in the original sequential circuit to a memory element having a variation output which outputs a variation signal indicative of a variation occurred in the content of the memory element. In this respect, embodiment 5 is different from embodiment 4. Hereinafter, the variation detection means-generation means is described.

Figure 24:
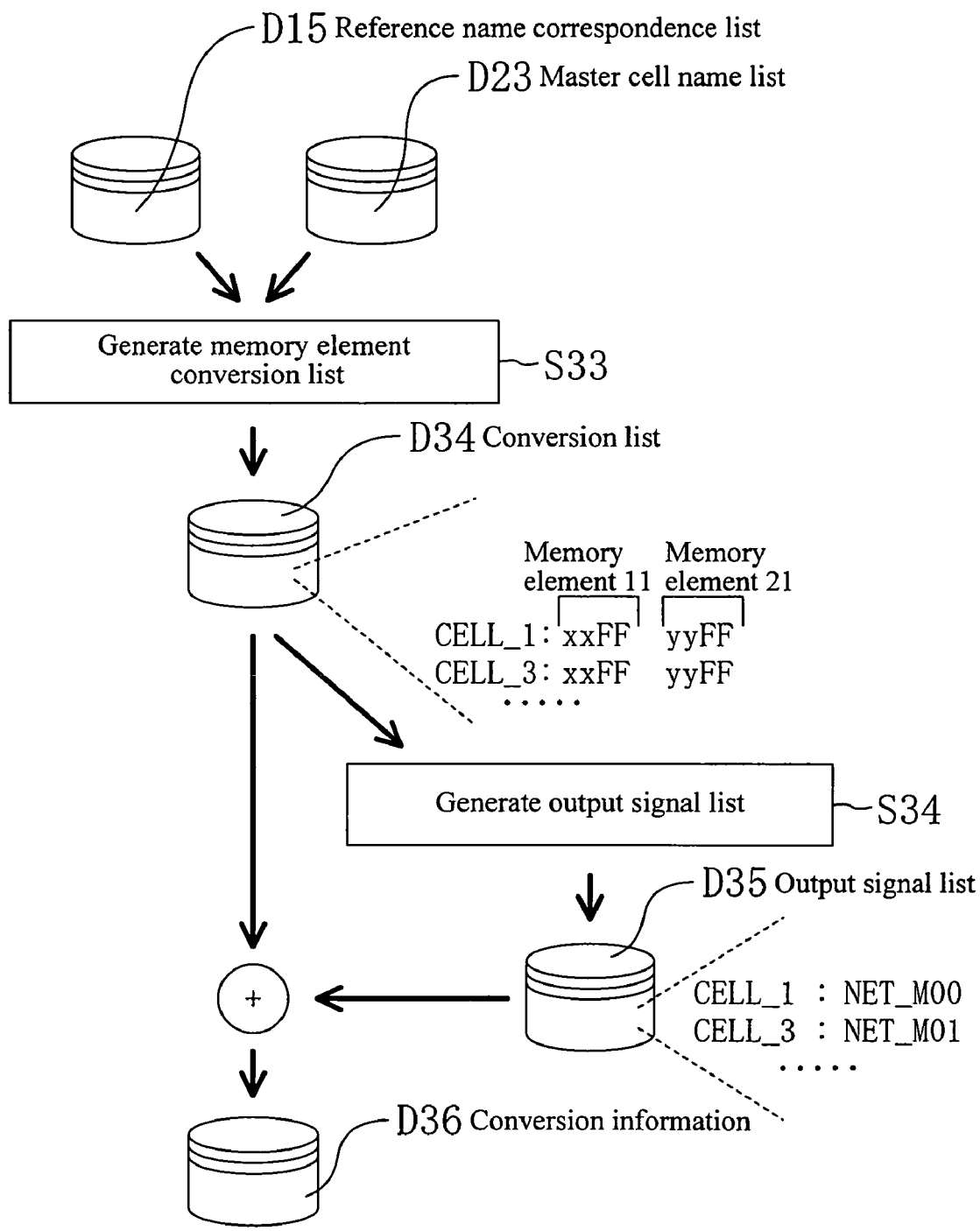
FIG. 24 is a flowchart of variation detector generation means according to embodiment 5 of the present invention.

FIG. 24 shows the process flow of the variation detection means-generation means of embodiment 5. First, among the master cells included in the master cell name list D23, cells registered in a reference name correspondence list D15 are extracted to generate a memory element conversion list D34 (S33). The reference name correspondence list D15 is a list in which memory elements 11 of the original sequential circuit which are to be converted to memory elements 21 each having a variation output are registered. Then, for each memory element registered in the memory element conversion list D34, a variation signal ("NET_M00" and "NET_M01" in the example of FIG. 24) is newly defined to generate an output signal list D35 (S34). The memory element conversion list D34 and the output signal list D35 are combined to generate conversion information D36.

Figure 25:
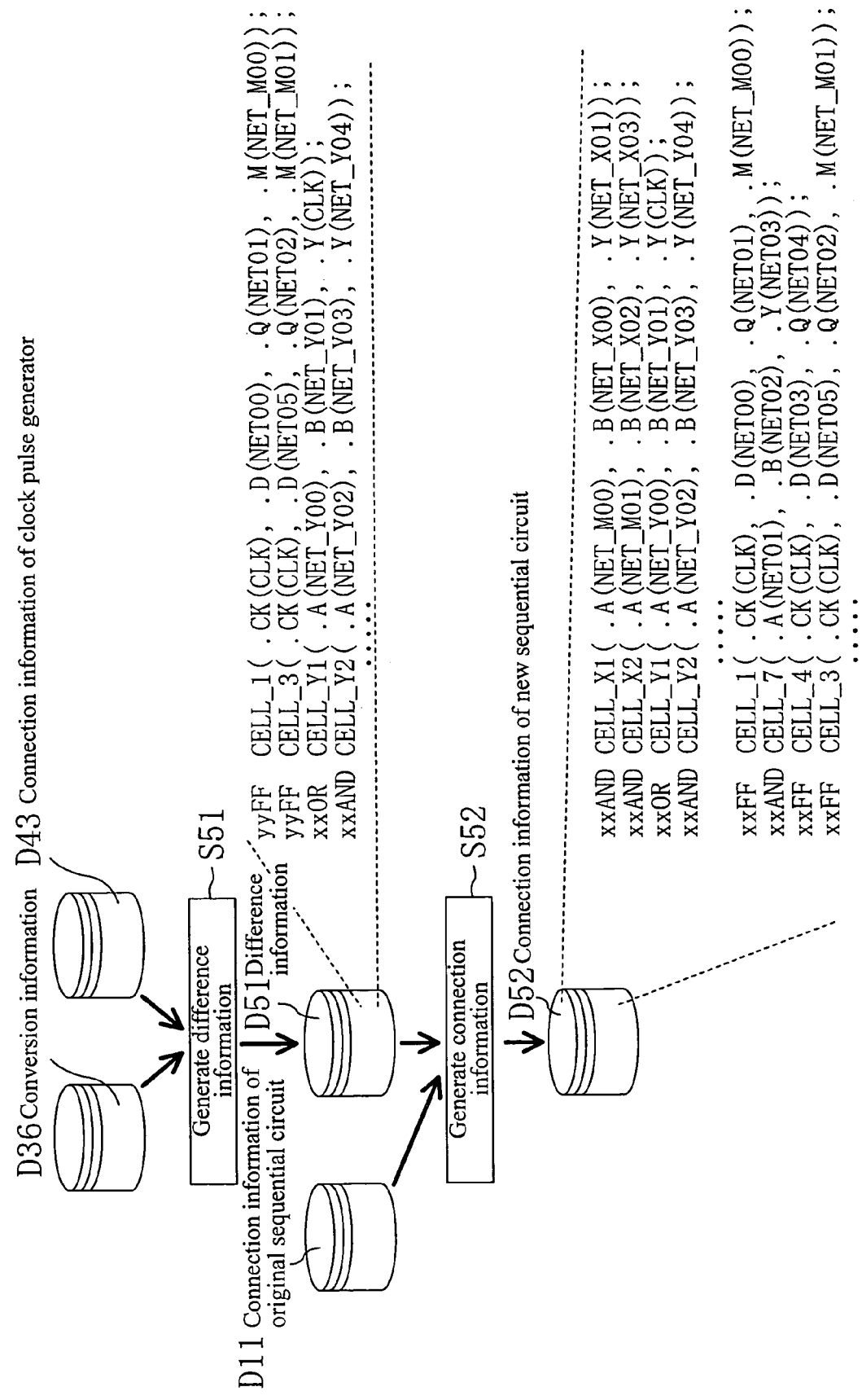
FIG. 25 is a flowchart of connection information synthesizing means according to embodiment 5 of the present invention.

FIG. 25 shows parts of the difference information D51 and the connection information D52 of the new sequential circuit which are generated by the connection information synthesizing means of embodiment 5. As shown in FIG. 25, memory elements having a variation output ("CELL_1" and "CELL_3" in the example of FIG. 25) are included in the difference information D51, and the memory elements in the connection information D52 of the new sequential circuit are replaced with memory elements having a variation output.

As described above, according to embodiment 5, it is possible to readily convert, with a reduced number of steps, a general sequential circuit to a sequential circuit (new sequential circuit) of the present invention which includes a memory element having a variation output.

Embodiment 6

FIG. 26 shows a general structure of a circuit-designing support system according to embodiment 6 of the present invention. The circuit-designing support system 130 of embodiment 6 obtains connection information D52 of a new sequential circuit based on connection information D11 of an original sequential circuit which includes a plurality of memory elements which update their contents in synchronization with a supplied clock. Herein, the new sequential circuit is the sequential circuit 30 of embodiment 3 which includes a clock pulse generation request signal line.

The circuit-designing support system 130 includes slave cell extraction means, master cell group extraction means, variation detection means-generation means, clock pulse generator generation means, and connection information synthesizing means, which are the same as those described in embodiment 4. The circuit-designing support system 130 further includes a clock pulse generator conversion means for converting the clock pulse generator of embodiment 1 or 2 to the clock pulse generator having an update output of embodiment 3. Hereinafter, the clock pulse generator conversion means is described.

Figure 27:
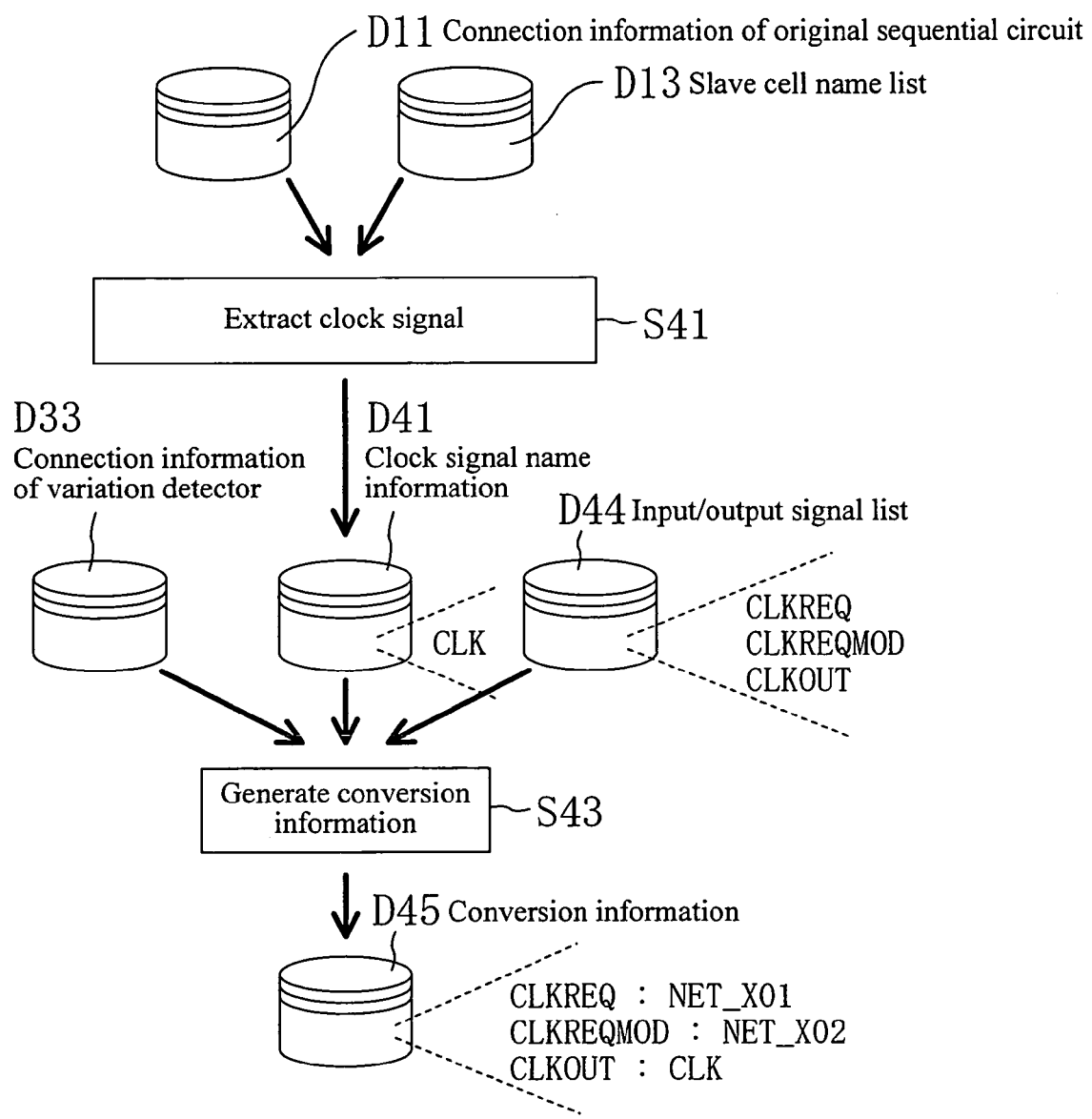
FIG. 27 is a flowchart of a clock pulse generator conversion means.

FIG. 27 shows the process flow of the clock pulse generator conversion means. First, clock signal name information D41 of a clock pulse generator to be converted is generated based on the connection information D11 of the original sequential circuit and the slave cell name list D13 (S41). Then, conversion information D45 of the clock pulse generator is generated based on the connection information D33 of the variation detector which generates an input (clock control signal) of the clock pulse generator, the clock signal name information D41 of the clock pulse generator, and an input/output signal list D44 in which inputs/outputs of a clock pulse generator having an update output are registered (S43).

Figure 28:
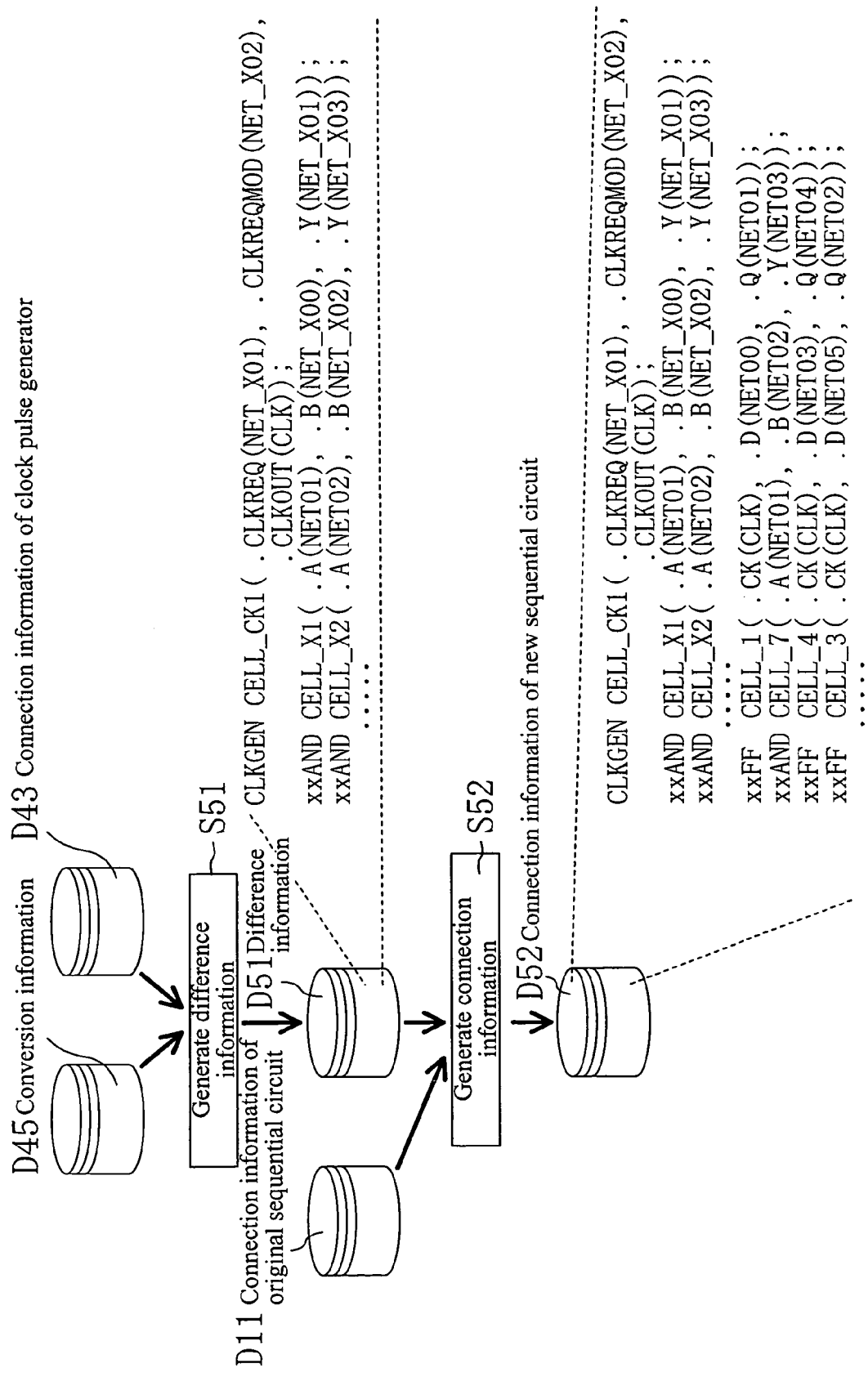
FIG. 28 is a flowchart of connection information synthesizing means according to embodiment 6 of the present invention.

FIG. 28 shows parts of difference information D51 and connection information D52 of a new sequential circuit which are generated by the connection information synthesizing means of embodiment 6. As shown in FIG. 28, a clock pulse generator having an update output ("CELL_CK1" in the example of FIG. 28) is included in the difference information D51, and a clock pulse generator in the connection information D52 of the new sequential circuit is replaced with the clock pulse generator having an update output.

As described above, according to embodiment 6, it is possible to readily convert, with a reduced number of steps, a general sequential circuit to a sequential circuit (new sequential circuit) of the present invention which includes a clock pulse generator having an update output.

It should be noted that the circuit-designing support system 130 may include the variation detection means-generation means of embodiment 5 to convert a memory element in the original sequential circuit to a memory element having a variation output.

Embodiment 7

Figure 29:
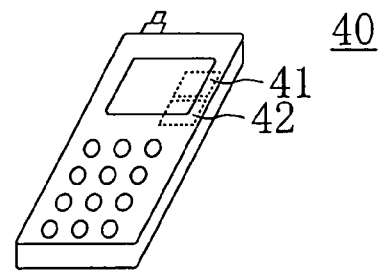
FIG. 29 illustrates a general structure of a communication device according to embodiment 7 of the present invention.

FIG. 29 shows a general structure of a communication device according to embodiment 7 of the present invention. A cellular mobile phone 40, which is an example of the communication device of embodiment 7, includes a baseband LSI device 41 and an application LSI device 42. Each of the baseband LSI device 41 and the application LSI device 42 is a semiconductor integrated circuit which includes a sequential circuit of the present invention, e.g., any of the sequential circuits 10, 20 and 30 of embodiments 1 to 3.

As described above, the sequential circuit of the present invention operates with reduced power consumption as compared with a conventional sequential circuit. Thus, the baseband LSI device 41 and the application LSI device 42, and the cellular mobile phone 40 including these LSI devices, also operate with reduced electric power. Even in a semiconductor integrated circuit included in the cellular mobile phone 40 other than the baseband LSI device 41 and the application LSI device 42, the above-described effects are obtained by replacing a sequential circuit of the semiconductor integrated circuit with the sequential circuit of the present invention.

The communication device of the present invention is not limited to a cellular mobile phone but may include, for example, a transmitter/receiver in a communication system, a modem device for performing data transfer, etc. That is, the present invention achieves the effect of reducing the power consumption in any communication device irrespective of whether it is wired or wireless, whether it is optical communication or electric communication, and whether it is digital or analog.

Embodiment 8

Figure 30:
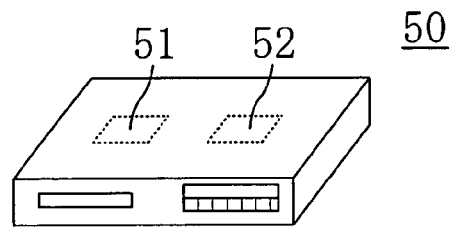
FIG. 30 illustrates a general structure of an information reproducing device according to embodiment 8 of the present invention.

FIG. 30 shows a general structure of an information reproducing device according to embodiment 8 of the present invention. An optical disc device 50, which is an example of the information reproducing device of embodiment 8, includes a media signal process LSI device 51 for processing a signal read from an optical disc and an error correction/servo process LSI device 52 for performing error correction of the signal and servo control of an optical pickup. Each of the media signal process LSI device 51 and the error correction/servo process LSI device 52 is a semiconductor integrated circuit which includes a sequential circuit of the present invention, e.g., any of the sequential circuits 10, 20 and 30 of embodiments 1 to 3.

As described above, the sequential circuit of the present invention operates with reduced power consumption as compared with a conventional sequential circuit. Thus, the media signal process LSI device 51 and the error correction/servo process LSI device 52, and the optical disc device 50 including these LSI devices, also operate with reduced electric power. Even in a semiconductor integrated circuit included in the optical disc device 50 other than the media signal process LSI device 51 and the error correction/servo process LSI device 52, the above-described effects are obtained by replacing a sequential circuit of the semiconductor integrated circuit with the sequential circuit of the present invention.

The information reproducing device of the present invention is not limited to an optical disc device but may include, for example, an image recording/reproducing device incorporating a magnetic disk, an information recording/reproducing device which includes a semiconductor memory as a medium, etc. That is, the present invention achieves the effect of reducing the power consumption in any information reproducing device (which may include an information recording function) irrespective of the type of medium in which information is recorded.

Embodiment 9

Figure 31:
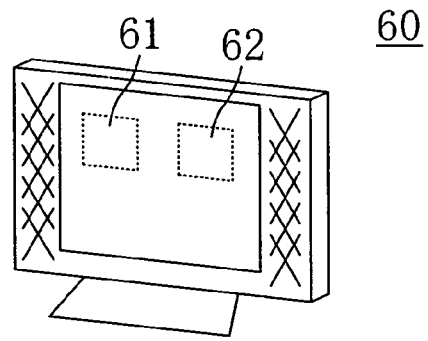
FIG. 31 illustrates a general structure of an image displaying device according to embodiment 9 of the present invention.

FIG. 31 shows a general structure of an image displaying device according to embodiment 9 of the present invention. A television set 60, which is an example of the image displaying device of embodiment 9, includes an image/sound process LSI device 61 for processing image signals and sound signals and a display/sound source control LSI device 62 for controlling a display screen and devices such as loudspeakers, etc. Each of the image/sound process LSI device 61 and the display/sound source control LSI device 62 is a semiconductor integrated circuit which includes a sequential circuit of the present invention, e.g., any of the sequential circuits 10, 20 and 30 of embodiments 1 to 3.

As described above, the sequential circuit of the present invention operates with reduced power consumption as compared with a conventional sequential circuit. Thus, the image/sound process LSI device 61 and the display/sound source control LSI device 62, and the television set 60 including these LSI devices, also operate with reduced electric power. Even in a semiconductor integrated circuit included in the television set 60 other than the image/sound process LSI device 61 and the display/sound source control LSI device 62, the above-described effects are obtained by replacing a sequential circuit of the semiconductor integrated circuit with the sequential circuit of the present invention.

The image displaying device of the present invention is not limited to a television set but may include, for example, a device for displaying streaming data distributed through an electric communication line. That is, the present invention achieves the effect of reducing the power consumption in any image displaying device irrespective of the method for transferring information.

Embodiment 10

Figure 32:
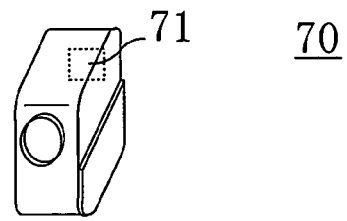
FIG. 32 illustrates a general structure of an electronic device according to embodiment 10 of the present invention.

FIG. 32 shows a general structure of an electronic device according to embodiment 10 of the present invention. A digital camera 70, which is an example of the electronic device of embodiment 10, includes a signal process LSI device 71. The signal process LSI device 71 is a semiconductor integrated circuit which includes a sequential circuit of the present invention, e.g., any of the sequential circuits 10, 20 and 30 of embodiments 1 to 3.

As described above, the sequential circuit of the present invention operates with reduced power consumption as compared with a conventional sequential circuit. Thus, the signal process LSI device 71 and the digital camera 70 including this LSI device also operate with reduced electric power. Even in a semiconductor integrated circuit included in the digital camera 70 other than the signal process LSI device 71, the above-described effects are obtained by replacing a sequential circuit of the semiconductor integrated circuit with the sequential circuit of the present invention.

The electronic device of the present invention is not limited to a digital camera but may include, for example, general electronic devices incorporating a semiconductor integrated circuit, such as various sensor devices, electronic computers, etc. That is, the present invention achieves the effect of reducing the power consumption in general electronic devices.

Embodiment 11

Figure 33:
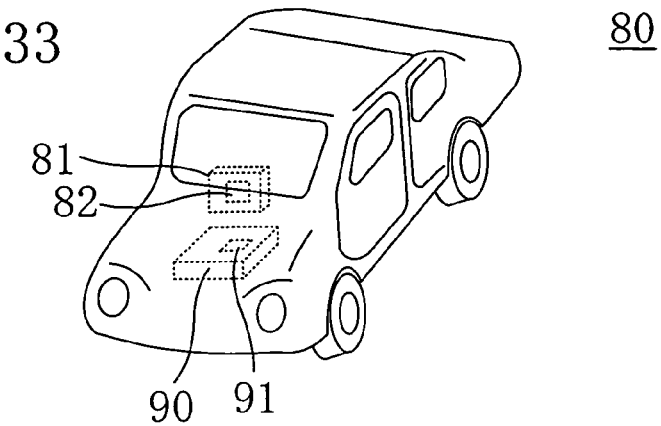
FIG. 33 illustrates a general structure of an electronic control device according to embodiment 11 of the present invention and a movable apparatus including the electronic control device.
Figure 34A:
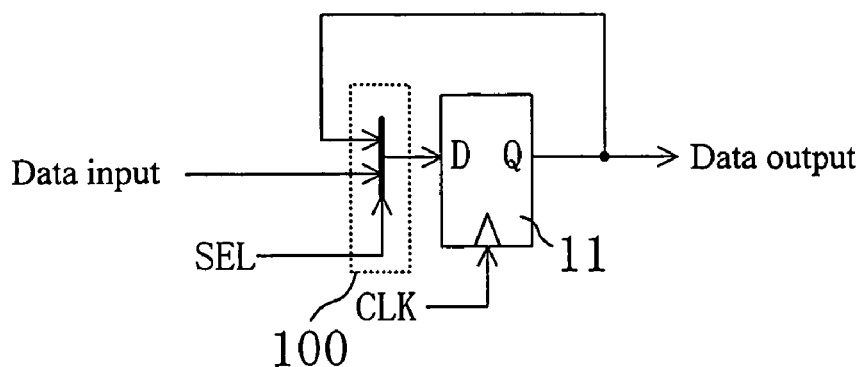
FIGS. 34A and 34B illustrate a general concept of a conventional clock control technique.
Figure 34B:
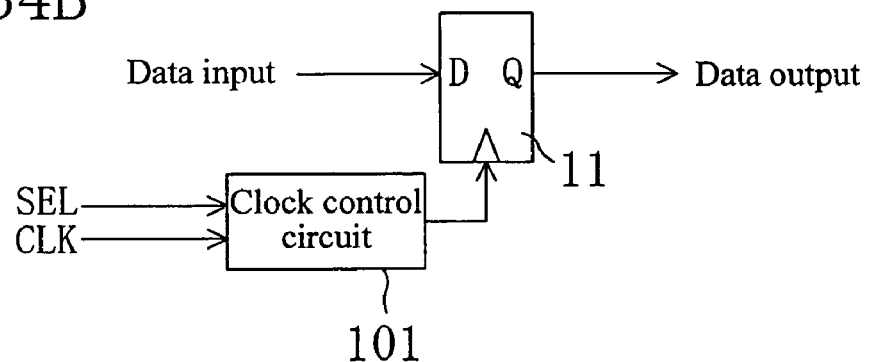
Figure 35A:
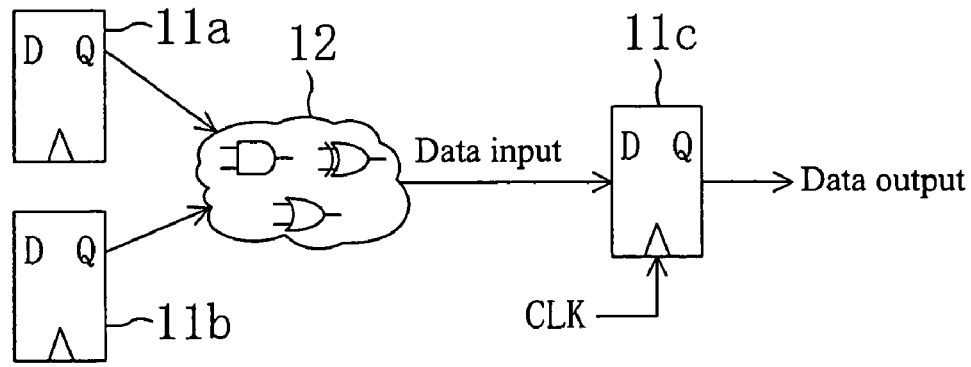
FIGS. 35A and 35B illustrate a general concept of another conventional clock control technique.
Figure 35B:
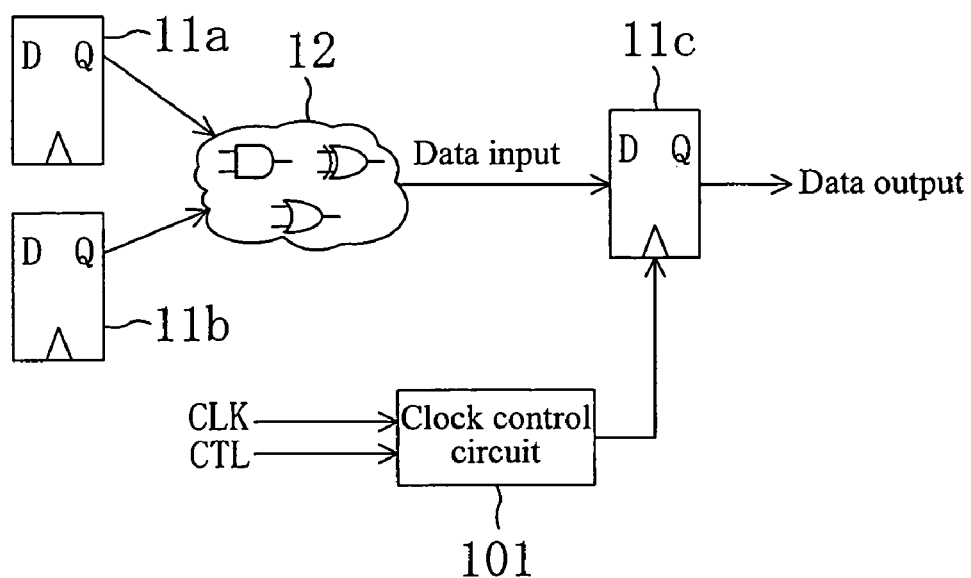

FIG. 33 shows a general structure of an electronic controller and a movable apparatus including the electronic controller according to embodiment 11 of the present invention. A car 80, which is an example of the movable apparatus of embodiment 11, includes an electronic controller 90. The electronic controller 90 includes an engine/transmission control LSI device 91 for controlling an engine and transmission system of the car 80. The engine/transmission control LSI device 91 is a semiconductor integrated circuit which includes a sequential circuit of the present invention, e.g., any of the sequential circuits 10, 20 and 30 of embodiments 1 to 3. The car 80 includes a navigation device 81 (corresponding to the electronic device of the present invention). The navigation device 81 includes a navigation LSI device 82 which is also a semiconductor integrated circuit including a sequential circuit of the present invention, e.g., any of the sequential circuits 10, 20 and 30 of embodiments 1 to 3.

As described above, the sequential circuit of the present invention operates with reduced power consumption as compared with a conventional sequential circuit. Thus, the engine/transmission control LSI device 91 and the electronic controller 90 including this LSI device also operate with reduced electric power. For the same reason, the navigation LSI device 82 and the navigation device 81 including this LSI device also operate with reduced electric power. Further, even in a semiconductor integrated circuit included in the electronic controller 90 other than the engine/transmission control LSI device 91, the above-described effects are obtained by replacing a sequential circuit of the semiconductor integrated circuit with the sequential circuit of the present invention. This also applies to the navigation device 81. Furthermore, the reduction in power consumption by the electronic controller 90 leads to a reduction in power consumption by the car 80.

The electronic controller of the present invention is not limited to the above-described controller for an engine or transmission but may include, for example, general controllers which incorporate a semiconductor integrated circuit and control a power source, such as a motor controller. That is, the present invention achieves the effect of reducing the power consumption in such electronic controllers.

The movable apparatus of the present invention is not limited to a car but may include, for example, general devices, such as a train, airplane, or the like, which includes electronic controllers for controlling power sources, such as an engine, motor, and the like. The present invention achieves the effect of reducing the power consumption in such movable apparatuses.

As described above, according to the present invention, it is possible in a sequential circuit to realize clock control with the assumptions that stop of a clock is impossible due to the specifications, and feedback of the output of a memory element does not exist. Thus, a sequential circuit capable of low-power operation is realized. Especially, a sequential circuit of the present invention does not include feedback of the output of a memory element, and therefore, a circuit structure and clock control are simplified and readily achieved.

According to the present invention, a circuit-designing support system is used to convert a general sequential circuit to the above-described sequential circuit. Thus, a sequential circuit capable of low-power operation is readily produced using already-accumulated circuit resources.

Furthermore, power consumption is reduced in a semiconductor integrated circuit incorporating a sequential circuit of the present invention, and in an electronic device or electronic controller including such a semiconductor integrated circuit. Further still, power consumption is reduced in a movable apparatus including such an electronic controller.

What is claimed is:

1. A sequential circuit comprising:
   a plurality of memory elements, each of which updates its content in synchronization with a supplied clock, the plurality of memory elements including a memory element which functions as a master cell and a memory element which functions as a slave cell, an input to the slave cell being varied when a content of the master cell is varied;
   variation detection means which outputs a variation signal when the content of the master cell is varied; and a clock pulse generator for generating a clock pulse based on the variation signal and supplying the clock pulse to the slave cell as the supplied clock.

2. The sequential circuit of claim 1, further comprising:
a master cell group including at least one said master cell; and
a clock domain including at least one said slave cell whose input is varied when a content of any of the master cells included in the master cell group is varied,
wherein the variation detection means outputs the variation signal when a content of any of the master cells included in the master cell group is varied; and
the clock pulse generator supplies the clock pulse to all of the slave cells included in the clock domain.

3. The sequential circuit of claim 1, wherein the variation detection means is a variation detector which determines whether or not the content of the master cell is varied based on an output signal of the master cell and which outputs the variation signal when the variation is detected.

4. The sequential circuit of claim 1, wherein:
the master cell is a memory element having a variation output, the memory element including a variation detection circuit which outputs an original variation signal indicative of a variation occurred in the content of the master cell; and
the variation detection means includes the variation detection circuit and outputs the variation signal based on the original variation signal output by the variation detection circuit.

5. The sequential circuit of claim 1, wherein:
the variation detection means includes a clock pulse generation request signal line for transmitting a request signal which requests the clock pulse generator to generate the clock pulse, the clock pulse generation request signal line changing the request signal to a first logic value when receiving the variation signal output by the variation detection means and changing the request signal to a second logic value when receiving a request update signal; and
the clock pulse generator is a clock pulse generator having an update output which generates the clock pulse and the request update signal when the request signal is changed to the first logic value, the request update signal being supplied to the clock pulse generation request signal line.

6. A memory element which updates its content in synchronization with a supplied clock, comprising:
a latch circuit which acquires a supplied signal when the supplied clock is changed to a first logic value and which retains the acquired signal as the content of the memory element when the supplied clock is changed to a second logic value; and a
variation detection circuit which outputs a variation signal indicative of a variation occurred in the content of the memory element when the input and output of the latch circuit are different and the supplied clock is changed to the first logic value,
wherein the output of the latch circuit is a first output;
the variation signal output from the variation detection circuit is a second output; and the first and second outputs are outputs of the memory elements.

7. The memory element of claim 6, further comprising a master latch circuit which acquires a supplied signal when the supplied clock is changed to the second logic value and which retains the acquired signal when the supplied clock is changed to the first logic value, wherein:

the latch circuit is a slave latch circuit for acquiring a signal output from the master latch; and
the variation detection circuit includes
a first logic element which outputs a predetermined logic value when the input and output of the slave latch circuit are different,
a delay element for delaying an output of the first logic element, and
a second logic element which outputs the variation signal when the output of the delay element is the predetermined logic value and the supplied clock has the first logic value.

8. The memory element of claim 6, wherein:
the variation detection circuit includes
a basic clock generation circuit for generating a basic clock which has a pulse width shorter than that of the supplied clock based on the supplied clock,
a first logic element which outputs a predetermined logic value when the input and output of the latch circuit are different, and
a second logic element which outputs the variation signal when an output of the first logic element is the predetermined logic value and the basic clock has the first logic value; and
the latch circuit receives the variation signal as the supplied clock.

9. A circuit modifying method for obtaining connection information of a new sequential circuit based on connection information of an original sequential circuit including a plurality of memory elements, each of which updates its content in synchronization with a supplied clock, the plurality of memory elements including a memory element which functions as a master cell and a memory element which functions as a slave cell, an input to the slave cell being varied when a content of the master cell is varied, the method comprising:
a slave cell extraction step of extracting the slave cell from connection information of the original sequential circuit;
a master cell group extraction step of extracting, for each extracted slave cell, a master cell group which includes at least one master cell corresponding to the slave cell from the connection information of the original sequential circuit;
a variation detection means generation step of generating connection information of variation detection means which outputs a variation signal when a content of any of the master cells included in the extracted master cell group is varied;
a clock pulse generator generation step of determining a clock domain so as to include some of the extracted slave cells whose extracted master cell groups are common, extracting a clock which is to be input to the slave cells included in the clock domain from connection information of the original sequential circuit, and generating connection information of a clock pulse generator based on the extracted clock; and
a connection information synthesizing step of synthesizing the connection information of the original sequential circuit, the connection information of the variation detection means which is generated at the variation detection means generation step, and the connection information of the clock pulse generator which is generated at the clock pulse generator generation step to obtain connection information of the new sequential circuit, wherein the clock pulse generator generates a clock pulse as the clock extracted at the clock pulse generator generation step based on a variation signal output from the variation detection means.

10. The circuit modifying method of claim 9, wherein:

the variation detection means is a variation detector which determines whether or not the content of the master cell is varied based on an output signal of the master cell and which outputs the variation signal when the variation is detected; and at the variation detection means generation step, one or more output signals of the at least one master cell included in the master cell group are extracted from the connection information of the original sequential circuit for each master cell group extracted at the master cell group extraction step, and connection information of the variation detector is generated based on the one or more extracted output signals.

11. The circuit modifying method of claim 9, wherein:

the master cell in the new sequential circuit is a memory element having a variation output, the memory element including a variation detection circuit which outputs an original variation signal indicative of a variation occurred in the content of the master cell;

the variation detection means includes the variation detection circuit and outputs the variation signal based on the original variation signal output by the variation detection circuit; and at the variation detection means generation step, conversion information which is used for converting the at least one master cell included in the master cell group extracted at the master cell group extraction step to the memory element having a variation output is generated as the connection information of the variation detection means.

12. The circuit modifying method of claim 9, wherein:

the variation detection means includes a clock pulse generation request signal line for transmitting a request signal which requests the clock pulse generator to generate the clock pulse, the clock pulse generation request signal line changing the request signal to a first logic value when receiving the variation signal output by the variation detection means and changing the request signal to a second logic value when receiving a request update signal;

the clock pulse generator is a clock pulse generator having an update output which generates the clock pulse and the request update signal when the request signal is changed to the first logic value, the request update signal being supplied to the clock pulse generation request signal line;

the circuit modifying method comprises a clock pulse generator conversion step of generating conversion information used for converting the connection information of the clock pulse generator which is generated at the clock pulse generator generation step to connection information of the clock pulse generator having an update output; and at the connection information synthesizing step, the connection information of the original sequential circuit, the connection information of the variation detection means which is generated at the variation detection means generation step, the connection information of the clock pulse generator which is generated at the clock pulse generator generation step, and the conversion information generated at the clock pulse generator conversion step are synthesized to obtain connection information of the new sequential circuit.

13. A circuit-designing support system for obtaining connection information of a new sequential circuit based on connection information of an original sequential circuit including a plurality of memory elements, each of which updates its content in synchronization with a supplied clock, the plurality of memory elements including a memory element which functions as a master cell and a memory element which functions as a slave cell, an input to the slave cell being varied when a content of the master cell is varied, the system comprising:

slave cell extraction means for extracting the slave cell from connection information of the original sequential circuit;

master cell group extraction means for extracting, for each extracted slave cell, a master cell group which includes at least one master cell corresponding to the slave cell from the connection information of the original sequential circuit;

variation detection means-generation means for generating connection information of variation detection means which outputs a variation signal when a content of any of the master cells included in the extracted master cell group is varied;

clock pulse generator generation means for determining a clock domain so as to include some of the extracted slave cells whose extracted master cell groups are common, extracting a clock which is to be input to the slave cells included in the clock domain from connection information of the original sequential circuit, and generating connection information of a clock pulse generator based on the extracted clock; and connection information synthesizing means for synthesizing the connection information of the original sequential circuit, the connection information of the variation detection means which is generated by the variation detection means-generation means, and the connection information of the clock pulse generator which is generated by the clock pulse generator generation means to obtain connection information of the new sequential circuit, wherein the clock pulse generator generates a clock pulse as the clock extracted by the clock pulse generator generation means based on a variation signal output from the variation detection means.

14. The circuit-designing support system of claim 13, wherein:

the variation detection means is a variation detector which determines whether or not the content of the master cell is varied based on an output signal of the master cell and which outputs the variation signal when the variation is detected; and the variation detection means-generation means extracts one or more output signals of the at least one master cell included in the master cell group from the connection information of the original sequential circuit for each master cell group extracted by the master cell group extraction means to generate connection information of the variation detector based on the one or more extracted output signal.

15. The circuit-designing support system of claim 13, wherein:

the master cell in the new sequential circuit is a memory element having a variation output, the memory element including a variation detection circuit which outputs an original variation signal indicative of a variation occurred in the content of the master cell;

the variation detection means includes the variation detection circuit and outputs the variation signal based on the original variation signal output by the variation detection circuit; and the variation detection means-generation means generates conversion information which is used for converting the at least one master cell included in the master cell group extracted by the master cell group extraction means to the memory element having a variation output as the connection information of the variation detection means.

16. The circuit-designing support system of claim 13, wherein:

the variation detection means includes a clock pulse generation request signal line for transmitting a request signal which requests the clock pulse generator to generate the clock pulse, the clock pulse generation request signal line changing the request signal to a first logic value when receiving the variation signal output by the variation detection means and changing the request signal to a second logic value when receiving a request update signal;

the clock pulse generator is a clock pulse generator having an update output which generates the clock pulse and the request update signal when the request signal is changed to the first logic value, the request update signal being supplied to the clock pulse generation request signal line;

the circuit-designing support system comprises clock pulse generator conversion means for generating conversion information used for converting the connection information of the clock pulse generator which is generated by the clock pulse generator generation means to connection information of the clock pulse generator having an update output; and the connection information synthesizing means synthesizes the connection information of the original sequential circuit, the connection information of the variation detection means which is generated by the variation detection means-generation means, the connection information of the clock pulse generator which is generated by the clock pulse generator generation means, and the conversion information generated by the clock pulse generator conversion means to obtain connection information of the new sequential circuit.

17. A semiconductor integrated circuit comprising a sequential circuit which includes a plurality of memory elements, each memory element updating its content in synchronization with a supplied clock, the plurality of memory elements including a memory element which functions as a master cell and a memory element which functions as a slave cell, an input to the slave cell being varied when a content of the master cell is varied, wherein the sequential circuit includes:

variation detection means which outputs a variation signal when the content of the master cell is varied; and a clock pulse generator for generating a clock pulse based on the variation signal and supplying the clock pulse to the slave cell as the supplied clock.

18. The semiconductor integrated circuit of claim 17, wherein the sequential circuit includes:

a master cell group including at least one said master cell; and a clock domain including at least one said slave cell whose input is varied when a content of any of the master cells included in the master cell group is varied, wherein the variation detection means outputs the variation signal when a content of any of the master cells included in the master cell group is varied, and the clock pulse generator supplies the clock pulse to all of the slave cells included in the clock domain.

19. The semiconductor integrated circuit of claim 17, wherein the variation detection means is a variation detector which determines whether or not the content of the master cell is varied based on an output signal of the master cell and which outputs the variation signal when the variation is detected.

20. The semiconductor integrated circuit of claim 17, wherein:

the master cell is a memory element having a variation output, the memory element including a variation detection circuit which outputs an original variation signal indicative of a variation occurred in the content of the master cell; and the variation detection means includes the variation detection circuit and outputs the variation signal based on the original variation signal output by the variation detection circuit.

21. The semiconductor integrated circuit of claim 17, wherein:

the variation detection means includes a clock pulse generation request signal line for transmitting a request signal which requests the clock pulse generator to generate the clock pulse, the clock pulse generation request signal line changing the request signal to a first logic value when receiving the variation signal output by the variation detection means and changing the request signal to a second logic value when receiving a request update signal; and the clock pulse generator is a clock pulse generator having an update output which generates the clock pulse and the request update signal when the request signal is changed to the first logic value, the request update signal being supplied to the clock pulse generation request signal line.

22. A communication device comprising a semiconductor integrated circuit, wherein the semiconductor integrated circuit comprises:

a sequential circuit which includes a plurality of memory elements, each memory element updating its content in synchronization with a supplied clock, the plurality of memory elements including a memory element which functions as a master cell and a memory element which functions as a slave cell, an input to the slave cell being varied when a content of the master cell is varied, wherein the sequential circuit includes:

variation detection means which outputs a variation signal when the content of the master cell is varied; and a clock pulse generator for generating a clock pulse based on the variation signal and supplying the clock pulse to the slave cell as the supplied clock.

23. An information reproducing device comprising a semiconductor integrated circuit, wherein the semiconductor integrated circuit comprises:

a sequential circuit which includes a plurality of memory elements, each memory element updating its content in synchronization with a supplied clock, the plurality of memory elements including a memory element which functions as a master cell and a memory element which functions as a slave cell, an input to the slave cell being varied when a content of the master cell is varied, wherein the sequential circuit includes:

variation detection means which outputs a variation signal when the content of the master cell is varied; and a clock pulse generator for generating a clock pulse based on the variation signal and supplying the clock pulse to the slave cell as the supplied clock.

24. An image display device comprising a semiconductor integrated circuit, wherein the semiconductor integrated circuit comprises:

a sequential circuit which includes a plurality of memory elements, each memory element updating its content in synchronization with a supplied clock, the plurality of memory elements including a memory element which functions as a master cell and a memory element which functions as a slave cell, an input to the slave cell being varied when a content of the master cell is varied, wherein the sequential circuit includes:

variation detection means which outputs a variation signal when the content of the master cell is varied; and a clock pulse generator for generating a clock pulse based on the variation signal and supplying the clock pulse to the slave cell as the supplied clock.

25. An electronic device comprising a semiconductor integrated circuit, wherein the semiconductor integrated circuit comprises:

a sequential circuit which includes a plurality of memory elements, each memory element updating its content in synchronization with a supplied clock, the plurality of memory elements including a memory element which functions as a master cell and a memory element which functions as a slave cell, an input to the slave cell being varied when a content of the master cell is varied, wherein the sequential circuit includes:

variation detection means which outputs a variation signal when the content of the master cell is varied; and a clock pulse generator for generating a clock pulse based on the variation signal and supplying the clock pulse to the slave cell as the supplied clock.

26. An electronic controller comprising a semiconductor integrated circuit, wherein the semiconductor integrated circuit comprises:

a sequential circuit which includes a plurality of memory elements, each memory element updating its content in synchronization with a supplied clock, the plurality of memory elements including a memory element which functions as a master cell and a memory element which functions as a slave cell, an input to the slave cell being varied when a content of the master cell is varied, wherein the sequential circuit includes:

variation detection means which outputs a variation signal when the content of the master cell is varied; and a clock pulse generator for generating a clock pulse based on the variation signal and supplying the clock pulse to the slave cell as the supplied clock.

27. A movable apparatus comprising an electronic controller, wherein the electronic controller comprises a semiconductor integrated circuit, and wherein the semiconductor integrated circuit comprises:

a sequential circuit which includes a plurality of memory elements, each memory element updating its content in synchronization with a supplied clock, the plurality of memory elements including a memory element which functions as a master cell and a memory element which functions as a slave cell, an input to the slave cell being varied when a content of the master cell is varied, wherein the sequential circuit includes:

variation detection means which outputs a variation signal when the content of the master cell is varied; and a clock pulse generator for generating a clock pulse based on the variation signal and supplying the clock pulse to the slave cell as the supplied clock.

* * * * *